United States Patent
Sousa

[11] Patent Number: 6,084,440
[45] Date of Patent: Jul. 4, 2000

[54] CIRCUITS AND METHODS FOR CANCELING HARMONIC DISTORTION IN SAMPLE AND HOLD CIRCUITS

[75] Inventor: Joseph Luis Sousa, Lawrence, Mass.

[73] Assignee: Linear Technology Corporation, Milpitas, Calif.

[21] Appl. No.: 09/060,561

[22] Filed: Apr. 15, 1998

[51] Int. Cl.$^7$ .................................................. G11C 27/02
[52] U.S. Cl. ............................................. 327/94; 327/96
[58] Field of Search .................................. 327/91, 92, 94, 327/96, 337, 554; 341/122, 150, 172, 143, 144

[56] References Cited

U.S. PATENT DOCUMENTS

| | | | |
|---|---|---|---|
| 4,999,585 | 3/1991 | Burt et al. | 332/149 |
| 5,206,543 | 4/1993 | Takita et al. | 327/94 |
| 5,892,473 | 4/1999 | Shin | 341/150 |

*Primary Examiner*—My-Trang Nu Ton
*Attorney, Agent, or Firm*—Fish & Neave; Robert W. Morris; Matthew T. Byrne

[57] ABSTRACT

The circuits and methods of the present invention provide sample and hold circuits that incorporate an auxiliary sampling leg that cancels distortion produced in a main sampling leg of the sample and hold circuit. The auxiliary sampling leg of the circuit produces canceling distortion that is proportionally larger than the distortion produced in the main sampling leg. The distortion in the auxiliary sampling leg is then reduced in size so that the canceling distortion becomes proportionally equal to the distortion in the main sampling leg. Finally, the proportionally equal canceling distortion of the auxiliary sampling leg is subtracted from the distortion of the main sampling leg so that substantially all of the distortion is canceled out while retaining a substantial portion of the input signal.

36 Claims, 16 Drawing Sheets

CIRCUITS AND METHODS FOR CANCELING HARMONIC DISTORTION IN SAMPLE AND HOLD CIRCUITS

BACKGROUND OF THE INVENTION

This invention relates to sample and hold circuits. More particularly, this invention relates to circuits and methods for canceling harmonic distortion produced in sample and hold circuits.

Sample and hold circuits are widely used to sample a voltage and hold it at a constant level so that another circuit such as an analog-to-digital converter connected to the sample and hold circuit can measure the held voltage. In many sample and hold circuits, however, harmonic distortion is produced by components of the circuits that limit the useful voltage range of an input signal, limit the useful frequency of the input signal and require a circuit designer to use more expensive components in the circuits to eliminate the distortion that would otherwise be caused by inferior components. This distortion may be produced, for example, by non-linear resistance characteristics of switches in the sample and hold circuits that are caused by effects such as MOSFET threshold turnoff, bulk effect, switch ratio match variations and process variations. This distortion may also be produced by parasitic capacitances of switches in the sample and hold circuits, charge injection modulation of some switches by other switches in the sample and hold circuits, non-linear load currents in input source resistances that are caused by semiconductor junctions of switches in the sample and hold circuits, and terminal resistances of switches in the sample and hold circuits.

SUMMARY OF THE INVENTION

In view of the foregoing, it is an object of the invention to provide circuits and methods for canceling harmonic distortion that is produced in sample and hold circuits.

It is also an object of the invention to provide circuits and methods for canceling harmonic distortion that is produced in sample and hold circuits that is caused by non-linear resistance characteristics of switches in the sample and hold circuits.

It is a further object of the invention to provide circuits and methods for canceling harmonic distortion that is produced in sample and hold circuits that is caused by parasitic capacitances of switches in the sample and hold circuits.

It is a still further object of the invention to provide circuits and methods for canceling harmonic distortion that is produced in sample and hold circuits that is caused by charge injection modulation of switches in the sample and hold circuits.

It is an even further object of the invention to provide circuits and methods for canceling harmonic distortion that is produced in sample and hold circuits that is caused by non-linear load currents induced in input source resistances by semiconductor junctions of switches in the sample and hold circuits.

It is a yet further object of the invention to provide circuits and methods for canceling harmonic distortion that is produced in sample and hold circuits that is caused by terminal resistances of switches in the sample and hold circuits.

In accordance with the present invention, the above and other objects of the invention are accomplished by providing circuits and methods for canceling harmonic distortion that is produced in sample and hold circuits. More particularly, the circuits and methods of the present invention provide sample and hold circuits that each incorporate an auxiliary sampling leg which produces distortion for canceling distortion produced in a main sampling leg of the sample and hold circuit.

In order to cancel distortion produced in a main sampling leg of a sample and hold circuit of the present invention without also completely canceling the signal being sampled, an auxiliary sampling leg of the circuit first produces canceling distortion that is proportionally larger with respect to the sampled signal than the distortion produced in the main sampling leg. When the proportionally larger canceling distortion is being produced in the auxiliary sampling leg, the signal being sampled in the auxiliary sampling leg is retained at a size that is proportionally equal to that in the main sampling leg. Both the distortion and the sampled signal in the auxiliary sampling leg are then reduced in size so that the canceling distortion becomes proportionally equal in size to the distortion in the main sampling leg, and so that the sampled signal in the auxiliary sampling leg becomes proportionally smaller than the sampled signal in the main sampling leg.

Finally, the proportionally smaller sampled signal and the proportionally equal canceling distortion of the auxiliary sampling leg are subtracted from the sampled signal and the distortion of the main sampling leg so that substantially all of the distortion, and only a portion of the sampled signal, are canceled out. In this way, harmonic distortion is canceled by distortion produced in the auxiliary sampling leg.

BRIEF DESCRIPTION OF THE DRAWINGS

The above and other objects and advantages of the present invention will be apparent upon consideration of the following detailed description, taken in conjunction with accompanying drawings, in which like reference characters refer to like parts throughout, and in which.

DETAILED DESCRIPTION OF THE INVENTION

In accordance with the present invention, circuits and methods for canceling harmonic distortion in sample and hold circuits are provided.

Figure 1:
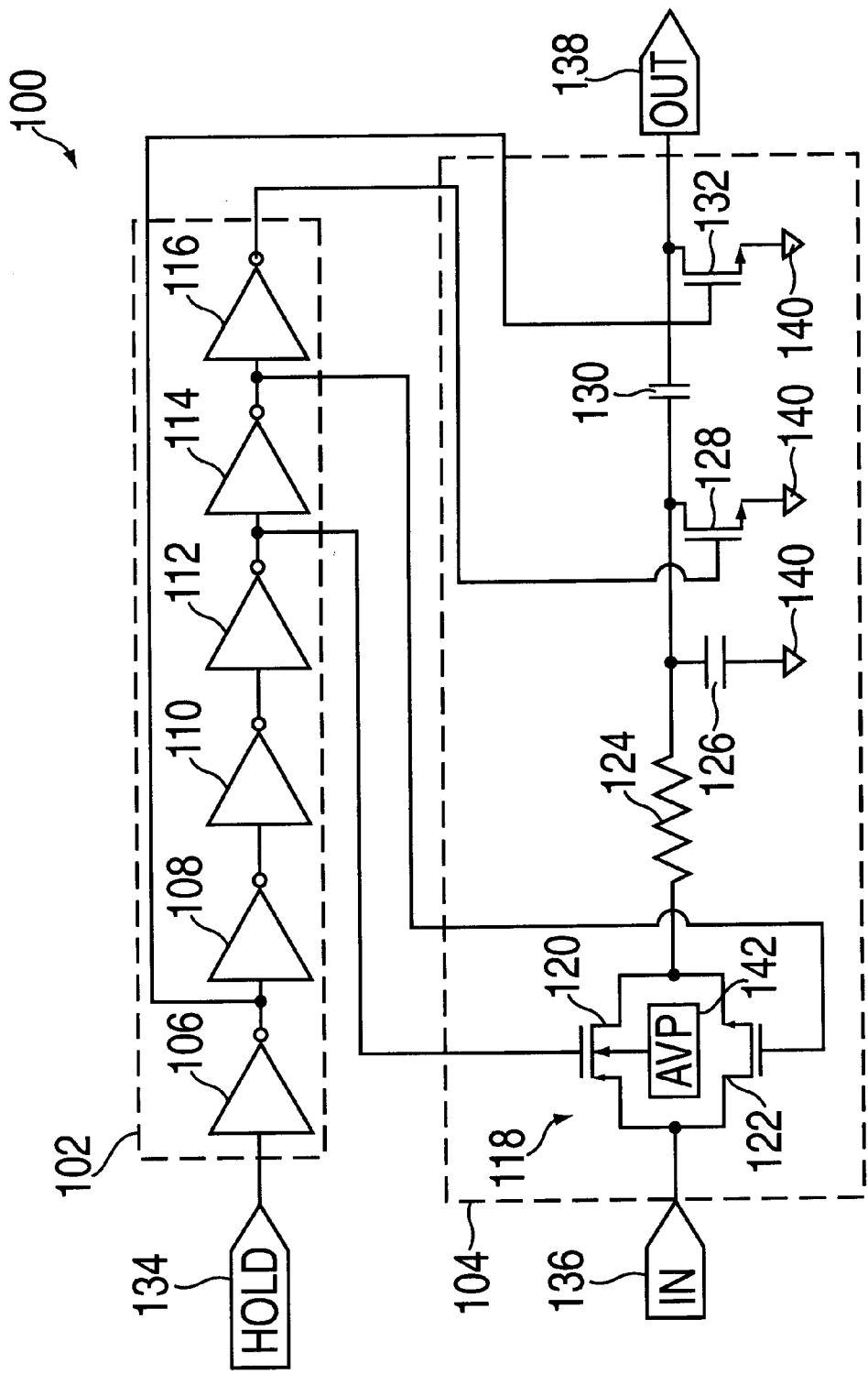
FIG. 1 is a schematic diagram of a known sample and hold circuit.

Referring to FIG. 1, a known sample and hold circuit 100 is illustrated. Circuit 100 comprises inverter bank 102 that controls the timing of circuit 100 in response to a hold signal received at hold input 134, and main sampling leg 104 that tracks and holds a voltage received at signal input 136 so that the voltage can be measured at signal output 138. Inverter bank 102 consists of six inverters 106, 108, 110, 112, 114 and 116. Main sampling leg 104 consists of input steering switch pair 118 (formed by input steering switches 120 and 122), pedestal resistor 124, pedestal capacitor 126, ground steering switch 128, sampling capacitor 130 and sampling switch 132. As illustrated, switches 120, 122, 128 and 132 are MOSFETs, however JFETs, BJTs, and/or any other suitable switching devices could also be used to implement circuit 100. Although not shown in the illustration of FIG. 1, the substrates of all N-channel MOSFET switches 122, 128, and 132 are preferably connected to ground 140.

As shown, inverters 106, 108, 110, 112, 114 and 116 are respectively connected in series, with the output of each inverter driving the input of the next inverter. The input of first inverter 106 is driven by hold input 134. Hold input 134 is an active-high input that, when transitioned from LOW to HIGH and held there, causes circuit 100 to sample and hold a voltage at signal input 136 so that the signal input can be measured at signal output 138. The outputs from inverters 106, 112, 114 and 116 are used to turn ON and OFF sampling switch 132, input steering switch 120, input steering switch 122 and ground steering switch 128, respectively.

As stated above, the input signal sampled by main sampling leg 104 is received from signal input 136. Signal input 136 is connected to the source of switch 120 and the drain of switch 122. The gates of switches 120 and 122 are connected to the outputs of inverters 112 and 114, respectively. The body terminal of switch 120 is connected to positive voltage supply 142 to prevent conduction from the drain or source to the body in switch 120. The drain of switch 120 and the source of switch 122 are tied together and connected to one side of pedestal resistor 124. The other side of pedestal resistor 124 is connected to one side of pedestal capacitor 126, the drain of ground steering switch 128 and one side of sampling capacitor 130. The other side of pedestal capacitor 126 and the source of switch 128 are connected to ground 140. The gate of switch 128 is connected to the output of inverter 116. The other side of sampling capacitor 130 is connected to the drain of sampling switch 132 and signal output 138. Finally, the source of sampling switch 132 is connected to ground 140 and the gate of sampling switch 132 is connected to the output of inverter 106.

In operation, sample and hold circuit 100 behaves as follows. When hold input 134 is LOW, the gate of switch 120 is driven LOW and the gate of switch 122 is driven HIGH by the outputs of inverters 112 and 114, respectively. This causes switches 120 and 122 to be turned ON. Also while hold input 134 is LOW, the gate of switch 128 is driven LOW and the gate of switch 132 is driven HIGH, causing switches 128 and 132 being turned OFF and ON, respectively. As a result of switches 120, 122, 128 and 132 being in these states, sampling capacitor 130 charges and discharges in response to voltage changes at signal input 136.

After hold input 134 transitions from LOW to HIGH, sampling switch 132 turns OFF, causing the charge on sampling capacitor 130 to become fixed. As switch 132 turns OFF, pedestal resistor 124 and pedestal capacitor 126 decouple sampling capacitor 130 from input steering switches 120 and 122 and signal input 136. Following propagation delays caused by inverters 108, 110, 112, and 114, input steering switches 120 and 122 also turn OFF, causing sampling capacitor 130 to become further isolated from signal input 136. Finally, ground steering switch 128 turns ON to provide a ground reference through which the voltage across sampling capacitor 130 can be measured at signal output 138.

As stated above, the present invention includes circuits and methods for canceling distortion that is created in one or more main sampling legs of a sample and hold circuit such as the one illustrated in FIG. 1. Sources of distortion in a main sampling leg 104 may include non-linear resistance characteristics of input steering switch pair 118, parasitic capacitances in input steering switch pair 118, charge injection modulation in sampling switch 132, and non-linear load currents that are caused to flow in input source resistances (not shown) by semiconductor junctions of input steering switch pair 118 and ground steering switch 128.

Figure 2:
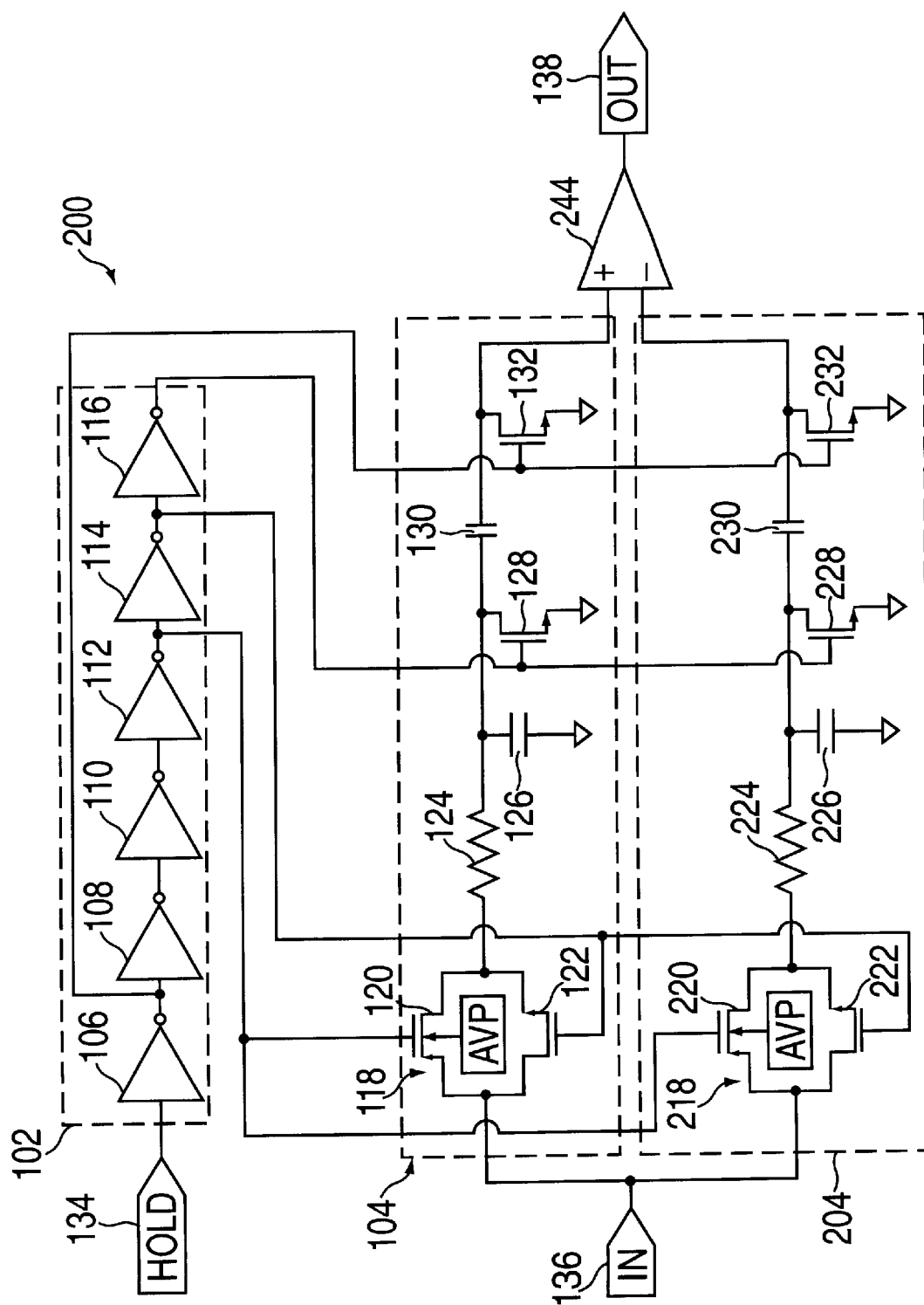
FIG. 2 is a schematic diagram of a sample and hold circuit incorporating an auxiliary sampling leg that produces canceling distortion in accordance with the present invention.

FIG. 2 illustrates a sample and hold circuit 200 that, in accordance with the principles of the present invention, includes auxiliary sampling leg 204 for canceling harmonic distortion caused by non-linear resistance characteristics of input steering switch pair 118 in main sampling leg 104. As illustrated, circuit 200 comprises inverter bank 102, main sampling leg 104 and auxiliary sampling leg 204 that are driven by signal input 136, and differential amplifier 244 that drives signal output 138 and that itself is driven by main sampling leg 104 and auxiliary sampling leg 204. The components of inverter bank 102 and main sampling leg 104 are substantially the same as those of circuit 100 described above with respect to FIG. 1.

The components of auxiliary sampling leg 204 are chosen to correspond to those in main sampling leg 104, and therefore, are substantially similar to the components of main sampling leg 104 (e.g., sampling switch 232 operates in substantially the same manner as sampling switch 132 of main leg 104). However, the sizes of these components will differ from those of the components in main sampling leg 104 as described below. Although circuit 200 is illustrated with pedestal resistors 124 and 224 and pedestal capacitors 126 and 226, the present invention may be implemented with either or both of these types of devices omitted.

In order for auxiliary sampling leg 204 of circuit 200 to cancel distortion produced in main sampling leg 104 without completely canceling the signal being sampled, the sizes of the components of auxiliary sampling leg 204 may be chosen to produce proportionally equal distortion to that created in main sampling leg 104 while only producing an output signal that is proportionally smaller than the output signal produced in main sampling leg 104. One approach to accomplishing this is to first increase the distortion in auxiliary sample leg 204 by some factor while maintaining an output signal of a constant size. After the distortion has been increased, the distortion and output signal are then both decreased by the same factor to produce proportionally equal distortion and a proportionally smaller output signal.

This approach can be implemented by properly selecting the sizes of input steering switch 220, input steering switch 222, pedestal capacitor 226 and sampling capacitor 230 in auxiliary sampling leg 204 with respect to the corresponding components in main sampling leg 104. First, to increase the distortion produced in auxiliary sampling leg 204 with respect to that produced in main sampling leg 104, without also increasing the size of the output signal, input steering switches 220 and 222 are selected that are smaller than input steering switches 120 and 122 of sampling leg 104. Additionally or alternatively, pedestal capacitor 226 and sampling capacitor 230 may be selected to have a total capacitance that is larger than the total capacitance of pedestal capacitor 126 and sampling capacitor 130 in main sampling leg 104. Then, to decrease the distortion and the output signal in auxiliary sampling leg 204 so that the distortion and output signal may be combined with that in main sampling leg 104, sampling capacitor 230 is chosen so that it is relatively smaller than sampling capacitor 130 in main sampling leg 104. Additionally or alternatively, the negative input of differential amplifier 244 may be selected with a smaller gain than the positive input to decrease the distortion in auxiliary sampling leg 204 so that it matches the distortion in main sampling leg 104 at the time of cancellation in differential amplifier 244.

For example, by selecting in auxiliary sampling leg 204, input steering switches 220 and 222 that are one-quarter of the size of input steering switches 120 and 122 in main sampling leg 104 and by selecting pedestal capacitor 226 and sampling capacitor 230 so that the total capacitance in auxiliary sampling leg 204 matches the total capacitance in main sampling leg 104, four times as much distortion is produced in auxiliary sampling leg 204 as is produced in main sampling leg 104. By then further selecting sampling capacitor 230 at one-quarter of the size of sampling capacitor 130, the output signal held in sampling capacitor 230 is only one-quarter of the size of the output signal held in sampling capacitor 130.

Because the distortion caused by input steering switches 220 and 222 in auxiliary sampling leg 204 is four times as large as the distortion caused by input steering switches 120 and 122 in main sampling leg 104, the distortion held in sampling capacitor 230 is equal to that held in sampling capacitor 130 and thus is canceled out. The output signal in sampling leg 204, however, is only one-quarter of the size of the output signal in main leg 104 so that the output signal in main leg 104 is not canceled out. Thus, when the output signals and distortion held in sampling capacitors 130 and 230 are input to differential amplifier 244, all of the distortion in capacitors 130 and 230 cancels out, while only one-quarter of the output signal is lost due to canceling.

Although a desired level of canceling distortion is illustrated as being producible in auxiliary sampling leg 204 by using a relatively smaller input steering switch pair 218 than is used in main sampling leg 104, other approaches can also be used. For example, any number of parallel and/or serial input steering switch pairs and/or input steering switches can be used to produce the desired distortion.

To compensate for the loss in output signal due to canceling, prior to selecting the components of auxiliary sampling leg 204, it may be desirable to increase the precancellation output signal of main sampling leg 104 by increasing the size of sampling capacitor 130 over the size that would be used in main sampling leg 104 if main leg 104 were not used with auxiliary sampling leg 204. In the example above, for instance, it may be desirable to increase sampling capacitor 130 in main sampling leg 104 by one-third, so that when one-quarter of the output signal is lost, the remaining output signal is as large as the corresponding signal in a circuit without distortion cancellation (i.e., increase the pre-cancellation output signal to 133%, so that when 25% of the output signal is lost due to cancellation, the resultant output signal remains at 100%).

To balance the sampling times in each of main sampling leg 104 and auxiliary sampling leg 204, it may be desirable to select pedestal resistors 124 and 224 so that the R-C time constants of each leg match. These time constants may be approximated for each leg by multiplying the sum of the resistances of input steering switch pair 118 or 218 (when ON) and pedestal resistor 124 or 224 by the sum of the capacitances of pedestal capacitor 126 or 226 and sampling capacitor 130 or 230. Thus, in the example above, because the total capacitance of each leg is equal, each of pedestal resistors 124 and 224 is selected so that the sum of the resistances of corresponding input steering switch pair 118 or 218 (when ON) and pedestal resistor 124 or 224 is equal for both legs.

It may also be desirable to select the size of pedestal resistor 224 so that any gain error produced in pedestal resistor 124 is canceled. This may be effected by using a pedestal resistor 224 that is larger than pedestal resistor 124 by the same ratio that sampling capacitor 130 is larger than sampling capacitor 230. In this way, the canceling distortion produced in pedestal resistor 224 is a given factor larger than the distortion produced in pedestal resistor 124. When this distortion is subsequently decreased in size by sampling capacitor 230, the canceling distortion is the same size as the distortion produced by pedestal resistor 124.

Figure 3:
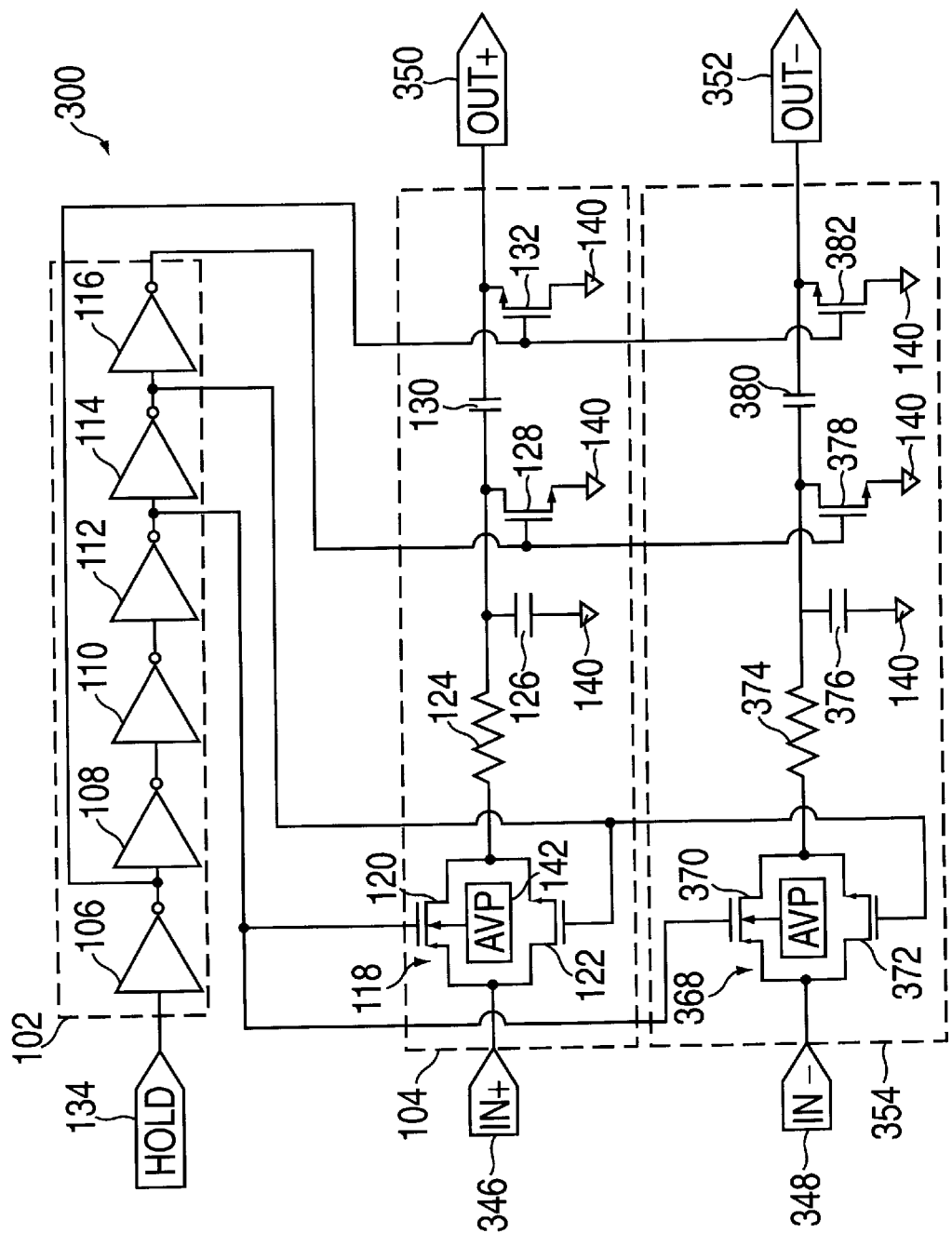
FIG. 3 is a schematic diagram of a known differential sample and hold circuit.

A known differential sample and hold circuit 300 is illustrated in FIG. 3. As shown, circuit 300 comprises inverter bank 102 that controls the timing of circuit 300, and positive main sampling leg 104 and negative main sampling leg 354 that track and hold voltages received at positive signal input 346 and negative signal input 348 so that the voltages can be measured at positive signal output 350 and negative signal output 352, respectively. Inverter bank 102 and positive main sampling leg 104 are substantially the same as described above for FIG. 1, except that the input and output designations of sampling leg 104 have been changed to 346 and 350, respectively, to indicate half of a differential pair. Negative main sampling leg 354 comprises input steering switch pair 368 (formed by input steering switches 370 and 372), pedestal resistor 374, pedestal capacitor 376, ground steering switch 378, sampling capacitor 380 and sampling switch 382.

In operation, each of positive main sampling leg 104 and negative main sampling leg 354 behave in substantially the same way as main sampling leg 104 of circuit 100 in FIG. 1. Circuit 300 is susceptible to the same sources of distortion in each of positive main sampling leg 104 and negative main sampling leg 354 as may be present in sampling leg 104 of circuit 100 of FIG. 1. To compensate for these sources of distortion, auxiliary sampling legs may be added to circuit 300 in the same manner as illustrated for (circuit 200 and described below with respect to FIG. 4.

Figure 4:
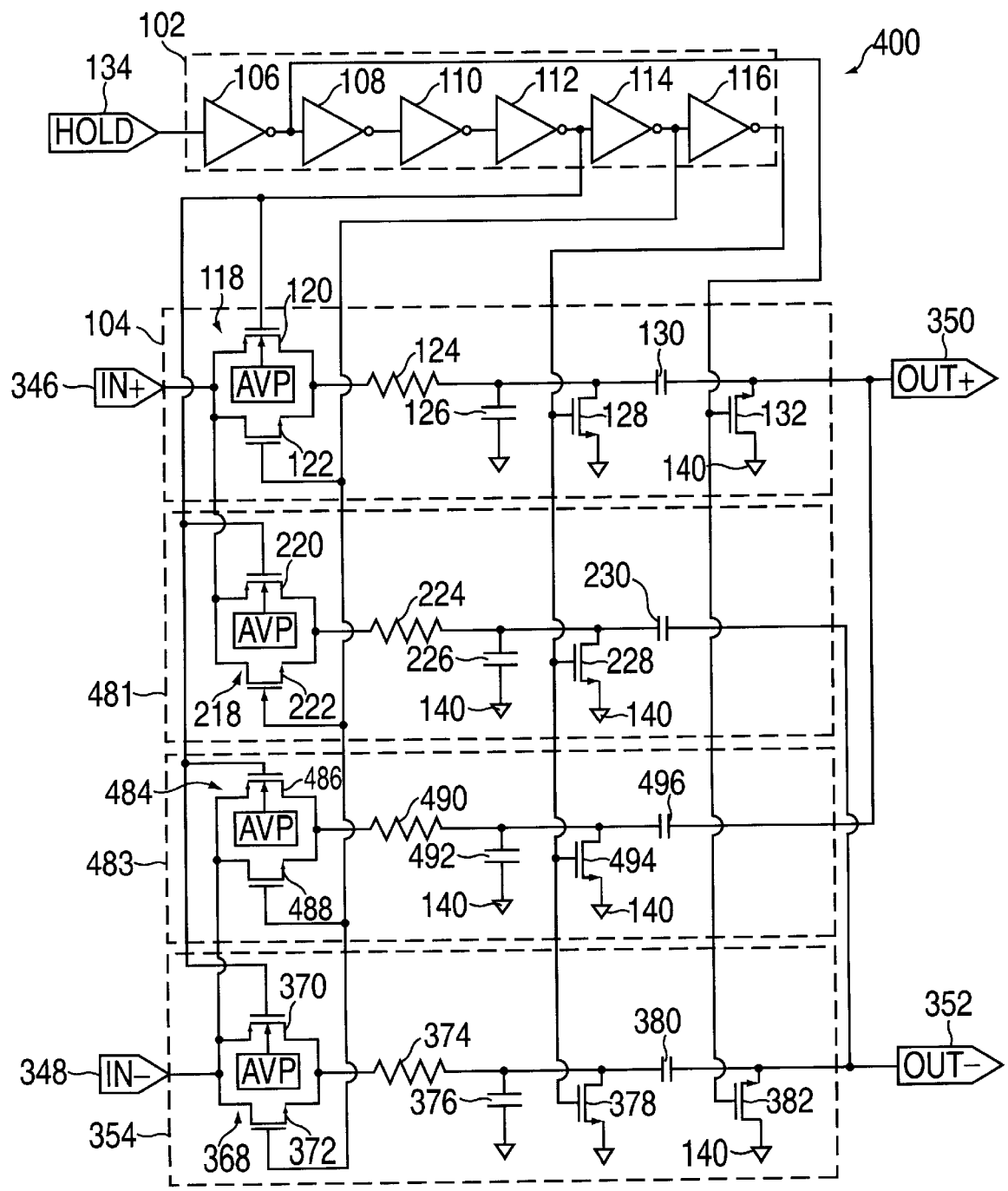
FIG. 4 is a schematic diagram of a differential sample and hold circuit incorporating two auxiliary sampling legs that each produce canceling distortion in accordance with the present invention.

FIG. 4 illustrates a differential sample and hold circuit 400 incorporating auxiliary sampling legs for canceling harmonic distortion in accordance with the present invention. As shown, circuit 400 comprises inverter bank 102, positive main sampling leg 104, negative main sampling leg 354, positive auxiliary sampling leg 481, and negative auxiliary sampling leg 483. The components of each of inverter bank 102, positive main sampling leg 104, and negative main sampling leg 354 are substantially the same as described above for circuit 300 in FIG. 3. Positive auxiliary sampling leg 481 is substantially the same as sampling leg 204 of FIG. 2 except that sampling switch 232 has been removed. Like, positive auxiliary sampling leg 481, negative auxiliary sampling leg 483 comprises input steering switch pair 484 (formed from input steering switches 486 and 488), pedestal resistor 490, pedestal capacitor 492, ground steering switch 494 and sampling capacitor 496.

Positive auxiliary sampling leg 481 receives its input from positive signal input 346. Positive signal input 346 is connected to the source of input steering switch 220 and the drain of input steering switch 222 in the same way that input 136 is connected to the source of switch 220 and the drain of switch 222 of sampling leg 204 of FIG. 2. The output of sampling capacitor 230 is connected to negative signal output 352 (instead of the negative input of amplifier 244 of FIG. 2). The components of negative auxiliary sampling leg 483 are arranged in substantially the same way as the components of positive auxiliary sampling leg 481, with the exceptions that the input to leg 483 is received from negative signal input 348 and sampling capacitor 496 is connected to positive signal output 350 instead of negative signal output 352.

In operation, circuit 400 behaves substantially the same as circuit 200 of FIG. 2 with the exception that two main sampling legs 104 and 354 and two auxiliary sampling legs 481 and 483 are utilized instead of one of each. Accordingly, when hold input 134 is LOW, sampling capacitors 130 and 230 track the input signal at positive signal input 346 and sampling capacitors 380 and 496 track the input signal at negative signal input 348. After hold input 134 is transitioned to HIGH and held there, sampling legs 104 and 481 sample and hold the signal at input 346, and sampling legs 483 and 354 sample and hold the signal at input 348. The signals sampled in legs 104 and 483 are then combined, and the signals sampled in legs 481 and 354 are also combined, and then the combined signals are output through positive signal output 350 and negative signal output 352.

As stated above in connection with circuit 200 of FIG. 2, the sizes of the components of each of auxiliary sampling legs 481 and 483 may be chosen to produce harmonic distortion that cancels harmonic distortion produced in main sampling legs 104 and 354 without completely canceling the corresponding output signal.

Figure 5:
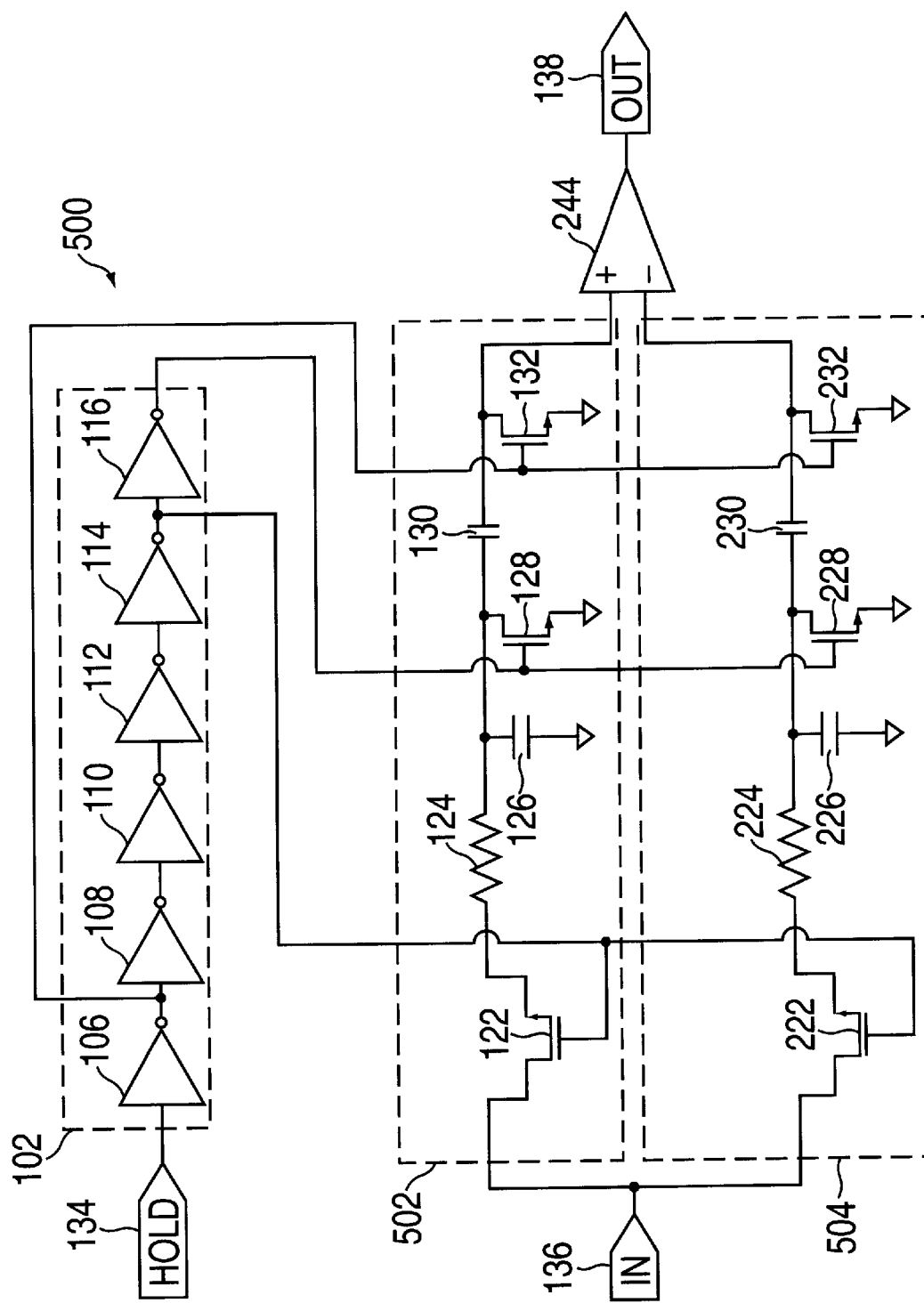
FIG. 5 is a schematic diagram of a sample and hold circuit with distortion cancellation that uses a single input steering switch rather than an input steering switch pair in each of a main sampling leg and an auxiliary sampling leg in accordance with the present invention.

FIG. 5 illustrates a circuit 500 that is a variation of circuit 200 illustrated in FIG. 2. Circuit 500 uses a single input steering switch 122 in main sampling leg 502 and a single input steering switch 222 in auxiliary sampling leg 504 instead of input steering switch pairs 118 and 218. Beside the elimination of input steering switches 120 and 220 and their respective connections of circuit 200 in FIG. 2 from circuit 500, the components of circuit 500 are substantially the same type as, are connected in substantially the same manner as, and operate in substantially the same way as the components of circuit 200 in FIG. 2, as described above. Because switches 120 and 220 (of FIG. 2) are eliminated from circuit 500, circuit 500 has worse distortion due to non-linear resistance in input steering switches 122 and 222 as compared with input steering switch pairs 118 and 218 of circuit 200. However, by eliminating switches 120 and 220, the parasitic capacitances that are introduced by these switches are also eliminated. Although switches 120 and 220 are illustrated as having been removed from circuit 500, switches 122 and 222 could alternatively have been eliminated in circuit 500.

Figure 6:
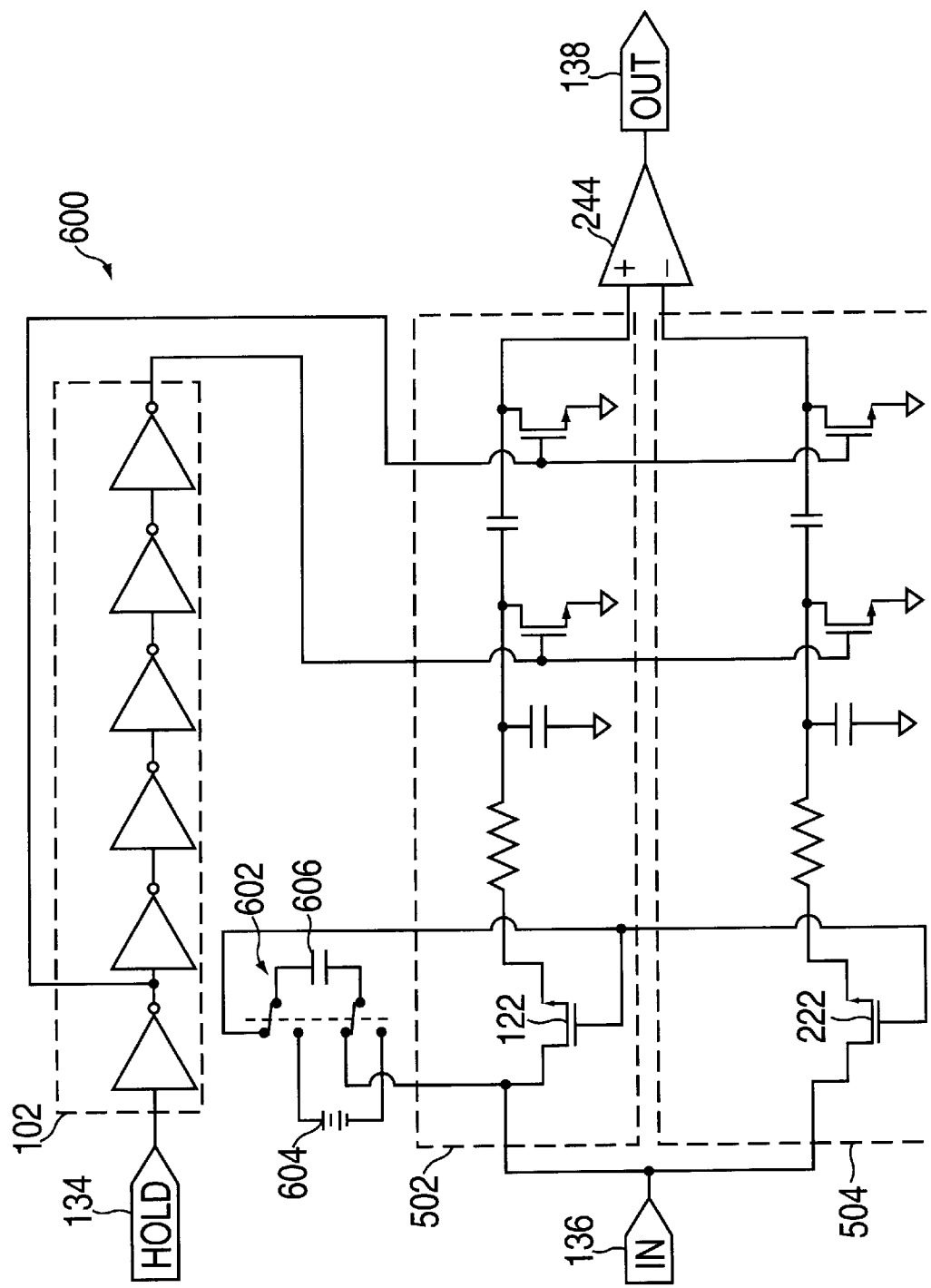
FIG. 6 is a schematic diagram of a sample and hold circuit with distortion cancellation in which the gate of a single input steering switch in each of a main sampling leg and an auxiliary sampling leg are biased by one side of a boot-strapped capacitor in accordance with the present invention.

FIG. 6 illustrates circuit 600 that is a variation of circuit 500 illustrated in FIG. 5 and that is a further variation of circuit 200 illustrated in FIG. 2. Rather than the gates of switches 122 and 222 being connected to the output of inverter 114 as shown in FIG. 5, these gates could alternatively be connected by way of switch 602 to capacitor 606. Capacitor 606 is charged by power supply 604 and then disconnected from power supply 604 and connected to the gates of switches 122 and 222 and to input 136 by switch 602 upon being fully charged. Beside these differences, the components of circuit 600 are substantially the same as described above for circuit 200 in FIG. 2 and circuit 500 in FIG. 5. By using a capacitor to drive the gates of switches 122 and 222, the gate to channel voltage of the switches is substantially fixed, resulting in improved linearity in the ON-resistance of each device.

Figure 7:
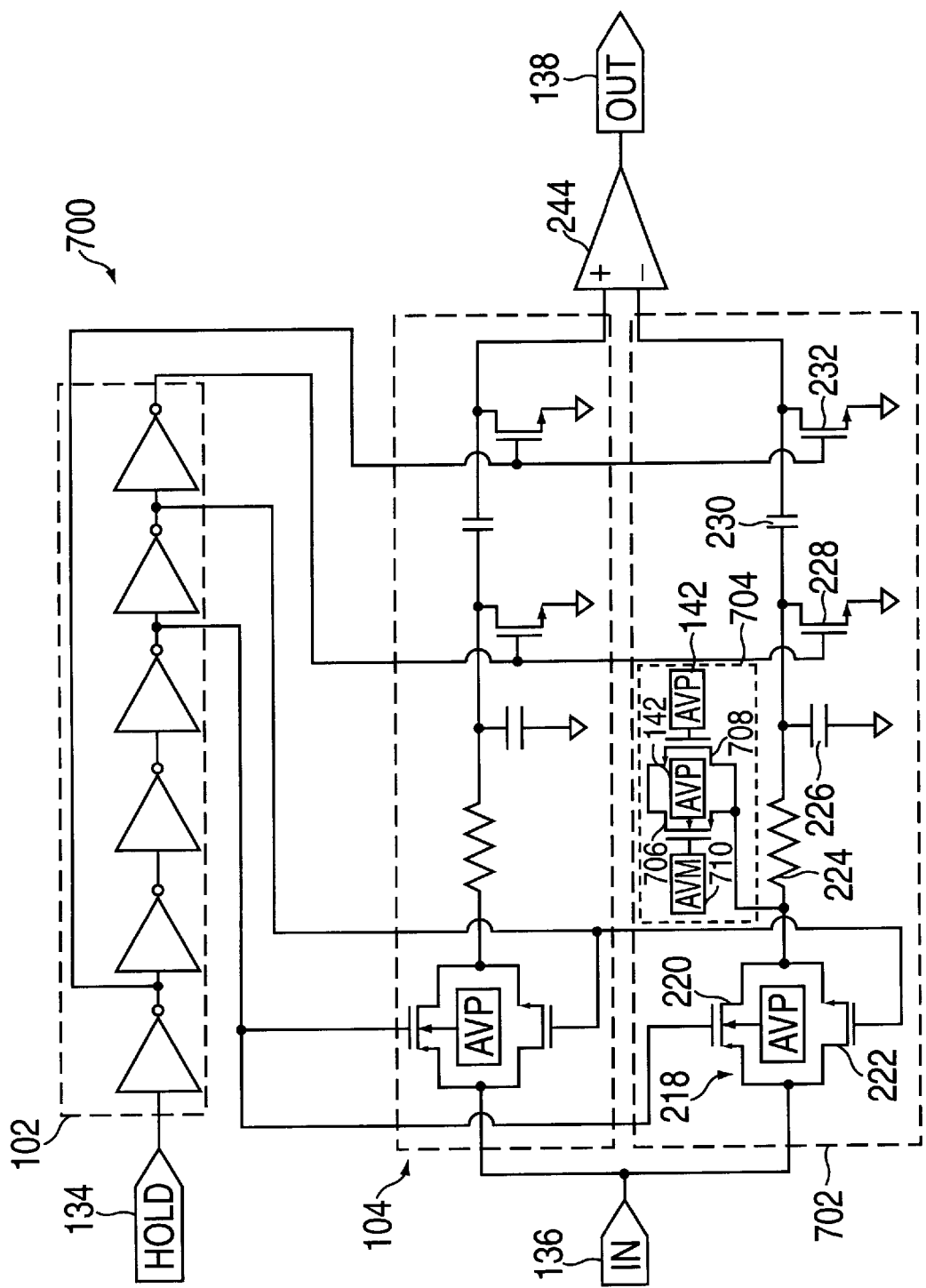
FIG. 7 is a schematic diagram of a sample and hold circuit incorporating an auxiliary sampling leg in which a capacitive load is used to produce canceling distortion that corresponds to distortion created in a main sampling leg by parasitic capacitances of an input steering switch pair in accordance with the present invention.

FIG. 7 illustrates a circuit 700 that is another variation of circuit 200 illustrated in FIG. 2 and which cancels distortion due to parasitic capacitance, as well as that due to non-linear resistance, in input steering switch pair 118 of main sampling leg 104. As shown, circuit 700 incorporates a capacitive load 704 in auxiliary sampling leg 702. Capacitive load 704 is formed from two switches 706 and 708 connected so that: the drain of switch 706 is connected to the source of switch 708; the source of switch 706 and the drain of switch 708 are connected to the drain of switch 220, the source of switch 222, and one side of pedestal resistor 224; the gate of switch 706 is connected to negative voltage supply 710; and the body terminal of switch 706 and the gate of switch 708 are connected to positive voltage supply 142. Beside the components and connections associated with capacitive load 704, the components of circuit 700 are substantially the same as those described above for circuit 200 of FIG. 2.

Switches 706 and 708 are preferably sized so that the distortion produced in auxiliary sampling leg 702 due to parasitic capacitance is increased by the same amount with respect to that in main sampling leg 104 as the distortion produced due to non-linear resistance. In this way, when differential amplifier 244 combines the outputs from main sampling leg 104 and auxiliary sampling leg 702, both the distortion due to non-linear resistance and the distortion due to parasitic capacitance are canceled out.

Figure 8:
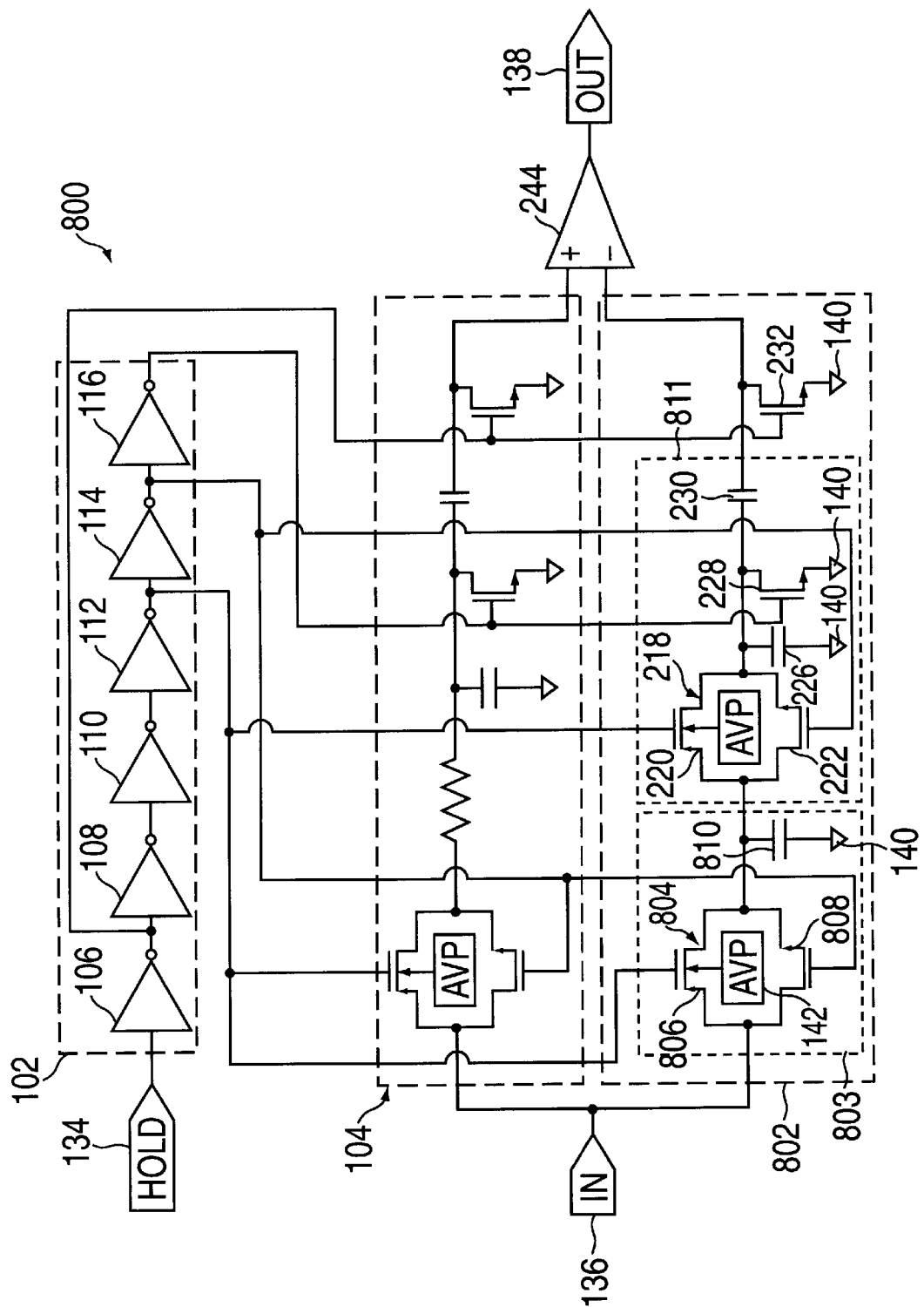
FIG. 8 is a schematic diagram of a sample and hold circuit in which the sampling time of an auxiliary sampling leg is improved by the use of cascaded sampling poles in accordance with the present invention.

FIG. 8 shows a circuit 800 that is yet another variation of circuit 200 in FIG. 2 in which cascaded sampling poles are used in an auxiliary sampling leg 802 to decrease sampling time of auxiliary sampling leg 802. As illustrated, circuit 800 comprises inverter bank 102, main sampling leg 104, auxiliary sampling leg 802 and differential amplifier 244. The components of inverter bank 102, main sampling leg 104, and differential amplifier 244 are substantially the same as described above. Auxiliary sampling leg 802 comprises first pole circuit 803, second pole circuit 811, and sampling switch 232. First pole circuit 80 includes input steering switch pair 804 (formed from input steering switches 806 and 808) and pedestal capacitor 810. Second pole circuit 811 is substantially similar to sampling leg 481 of FIG. 4 described above.

The input to auxiliary sampling leg 802 is received from signal input 136. Signal input 136 is connected to the source of input steering switch 806 and the drain of input steering switch 808. The gates of switches 804 and 808 are respectively connected to the outputs of inverters 112 and 114. The drain of switch 804 and the source of switch 808 are connected to one side of pedestal capacitor 810, the source of input steering switch 220 and the drain of input steering switch 222. The other side of pedestal capacitor 810 is connected to a ground 140. The gates of switches 220 and 222 are respectively connected to the outputs of inverters 112 and 114. The drain of switch 220 and the source of switch 222 are connected to one side of pedestal capacitor 226, the drain of ground steering switch 228 and one side of sampling capacitor 230. The other side of capacitor 226 and the source of switch 228 are connected to ground 140. The gate of switch 228 is connected to the output of inverter 116. The other side of sampling capacitor 230 is connected to the drain of sampling switch 232 and the negative input of differential amplifier 244. Finally, the gate of switch 232 is connected to the output of inverter 106 and the source of switch 232 is connected to ground 140.

In operation, auxiliary sampling circuit 802 of circuit 800 operates as follows. When hold input 134 is LOW, inverter 112 drives the gates of switches 806 and 220 LOW and inverter 114 drives the gates of switches 808 and 222 HIGH, causing switches 806, 220, 808, and 222 to be turned ON. Also while hold input 134 is LOW, the gates of switches 228 and 232 are driven LOW and HIGH by inverters 116 and 106, respectively, causing switches 228 and 232 to be respectively turned OFF and ON. With switches 220, 222, 228, 232, 806 and 808 in these states, pedestal capacitors 226 and 810 and sampling capacitor 230 track the voltage received at signal input 136.

When hold input 134 is transitioned from LOW to HIGH and held, switch 232 turns OFF, fixing the charge in sampling capacitor 230. At the time switch 232 turns OFF, pedestal capacitors 226 and 810 decouple sampling capacitor 230 front input steering switch pairs 218 and 804 and signal input 136. Switches 220, 222, 806 and 808 then turn OFF, further isolating sampling capacitor 230 from signal input 136. Finally, switch 228 turns ON, connecting one side of sampling capacitor 230 to ground 14C, thereby providing a reference through which the voltage on sampling capacitor 230 can be measured at the negative input of differential amplifier 244.

In order to cancel the distortion due to non-linear resistance variation in input steering switch pair 118 of main sampling leg 104, auxiliary sampling leg 802 produces a canceling distortion that is proportionally larger than the distortion produced in main sampling leg 104. A fraction of the canceling distortion is then subtracted from the distortion produced in main sampling leg 104 so that substantially all of the distortion produced in main sampling leg 104 is canceled. The distortion produced in auxiliary sampling leg 802 is increased by decreasing the size of input steering switch pair 804 with respect to the size of input steering switch pair 118 of main sampling leg 104. With reduced size, the ON-resistance of input steering switch pair 804 is also increased. This increase in ON-resistance causes the sampling time of auxiliary sampling leg 802 also to he increased over that of main sampling leg 104.

By using multiple cascaded sampling pole circuits 803 and 811 in auxiliary sampling leg 802, the sampling time of auxiliary sampling leg 802 is shortened over the sampling time of previously described auxiliary sampling leg 204 (of FIG. 2). For example, in circuit 200 of FIG. 2, by selecting an input steering switch pair 218 with four times the distortion of that of input steering switch pair 118, pedestal resistors 124 and 224 with zero ohm resistance, and pedestal capacitor 226 and sampling capacitor 230 with a combined capacitance equal to that of pedestal capacitor 126 and sampling capacitor 130, the sampling time of auxiliary sampling leg 204 is increased by four times over that of main sampling leg 104. In other words, if the ON-resistance of input steering switch pair 118 is R, the ON-resistance of input steering switch pair 218 is 4R. And if the total capacitance of both main sampling leg 104 and auxiliary sampling leg 204 is C, the sampling time constant of main sampling leg 104 is $R*C$ and the sampling time to 0.01% of sampling accuracy is $\ln (0.0001)*R*C=9.2RC$, whereas the sampling time constant of auxiliary sampling leg 204 is $4R*C$ and the sampling time to 0.01% of sampling accuracy is $\ln (0.0001)*4R*C=36.8RC$.

With properly selected values for input steering switch pairs 218 and 804 and capacitors 226, 230 and 810 in circuit 800 of FIG. 8, the sampling time of auxiliary sampling leg 802 can be improved over that of auxiliary sampling leg 204 of FIG. 2. In continuing the example above, selecting input steering switch pairs 804 and 218 each with distortions of two times that of input steering switch pair 812 causes the switch pairs to have ON-resistances of 2R and 4R, respectively, for a total resistance of 6R. Selecting capacitors 226, 230 and 810 with respective capacitances of 0.25C, 0.25C and 0.5C causes auxiliary sampling leg 802 to have a total capacitance of C (like auxiliary sampling leg 204 as described above). However, because pole circuit 803 has a sampling time constant of $R*C=RC$ and pole circuit 811 has a sampling time constant of $4R*(0.25C+0.25C)=2RC$, auxiliary sampling leg 802 has two time constants RC and 2RC that convolve together to produce a settling time to an arbitrary precision that is faster than that of auxiliary sampling leg 204.

Although circuit 800 is illustrated with two pole circuits 803 and 811, more pole circuits could also be used to further improve the sampling time of auxiliary sampling leg 802.

Figure 9:
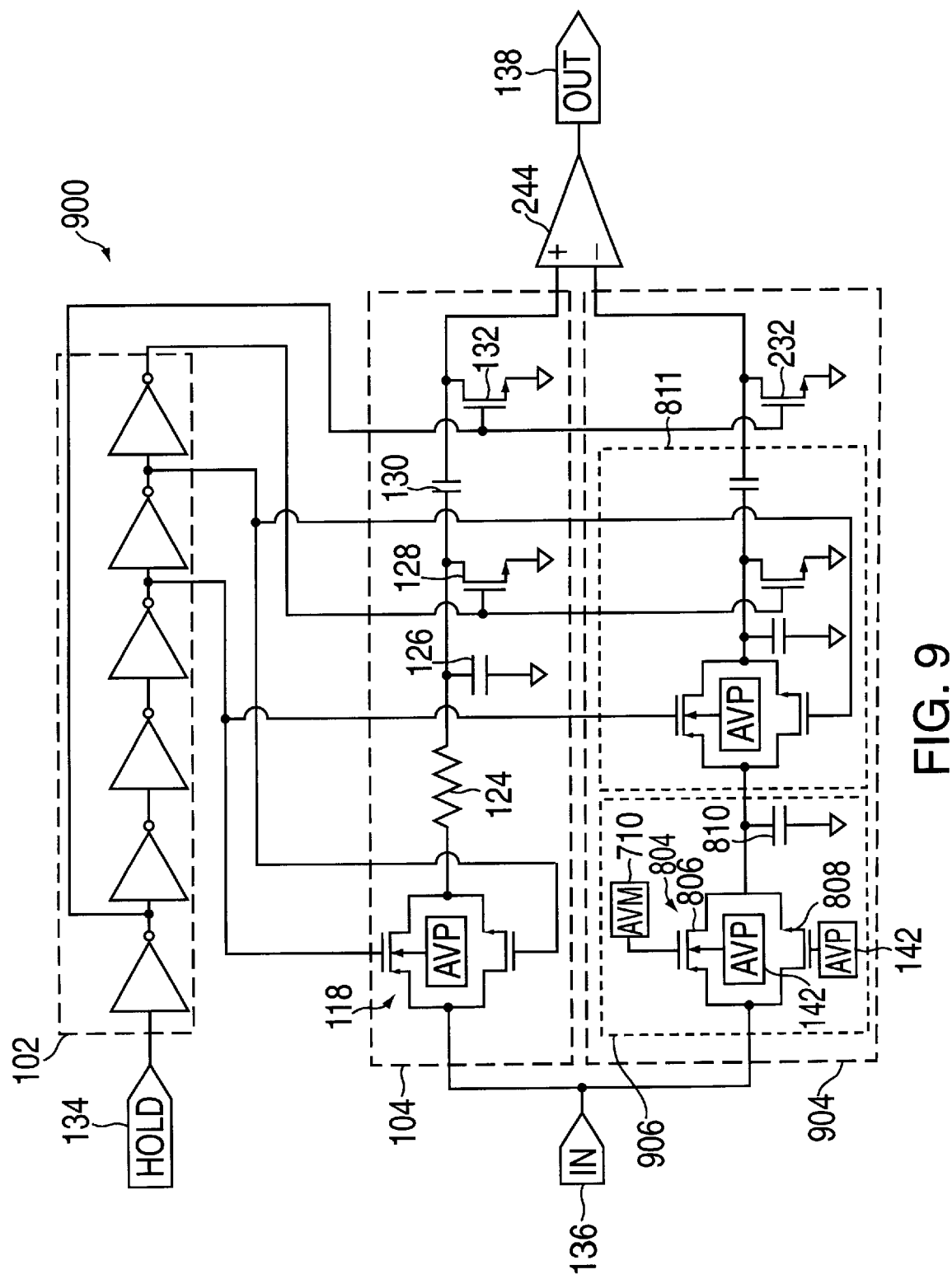
FIG. 9 is a schematic diagram of a sample and hold circuit in which the sampling time of an auxiliary sampling leg is further improved by keeping input steering switches in a first cascaded sampling pole always turned ON in accordance with the present invention.

A variation of circuit 800 that further shortens the sampling time of an auxiliary sampling leg with cascaded sampling poles is illustrated in circuit 900 of FIG. 9. As shown, rather than the gates of input steering switches 806 and 808 in first pole circuit 906 of auxiliary sampling leg 904 being connected to the outputs of inverters 112 and 114, respectively, as illustrated and explained above in connection with FIG. 8, the gates of switches 806 and 808 are respectively connected to negative voltage supply 710 and positive voltage supply 142 so that switches 806 and 808 are always turned ON. In this way, the sampling time of auxiliary sampling leg 904 is almost shortened to that of second pole circuit 811, which, as explained above in connection with circuit 800, is a fraction of the total sampling time of auxiliary sampling leg 802.

Figure 10:
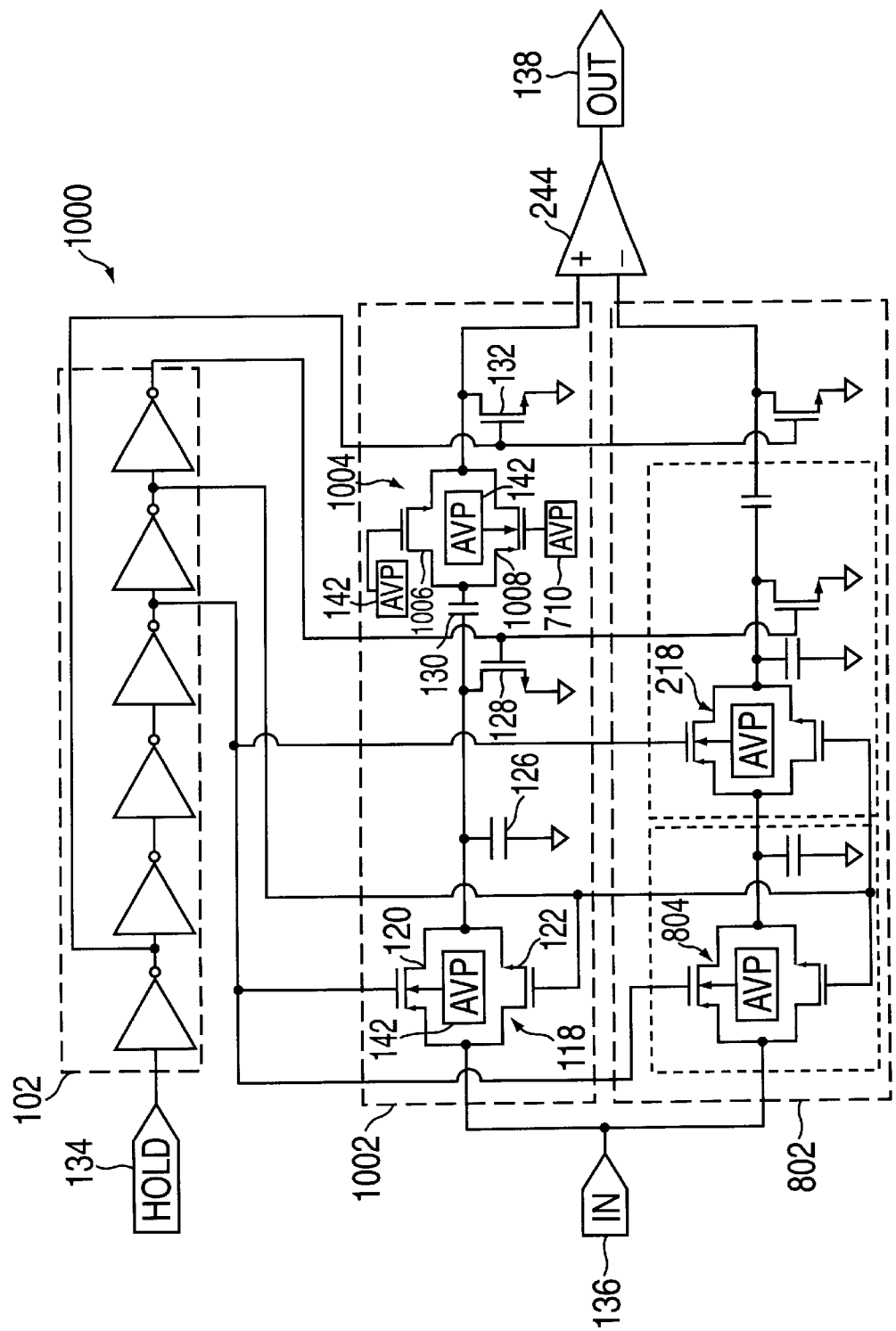
FIG. 10 is a schematic diagram of a sample and hold circuit in which a pedestal resistor in a main sampling leg is replaced with a steering switch resistance to better match the sampling time of the auxiliary sampling leg in accordance with the present invention.

Another variation of circuit 800 that balances the sampling times of the main sampling leg and the auxiliary sampling leg is illustrated in circuit 1000 of FIG. 10. In this variation, steering switch pair resistance 1004 is used in main sampling leg 1002 rather than pedestal resistor 124 as previously described. By using steering switch pair resistance 1004 instead of resistor 124, the balancing of sampling times is independent of manufacturing process variations, temperature, and other second order effects.

Steering switch pair resistance 1004 is formed from switches 1006 and 1008 and replaces the connection from sampling capacitor 130 to the drain of sampling switch 132 and the positive input to differential amplifier 244. These switches are arranged with the drain of switch 1006 and the source of switch 1008 connected to the output side of sampling capacitor 130. The gate of switch 1006 and the body terminal of switch 1008 are connected to positive voltage supply 142, and the gate of switch 1008 is connected to negative voltage supply 710. The source of switch 1006 and the drain of switch 1008 are connected to the drain of sampling switch 132 and the positive input of differential amplifier 244. Steering switch pair resistance 1004 is preferably selected so that the sampling time of main sampling leg 1002 is equal to the sampling time of auxiliary sampling leg 802.

Figure 11:
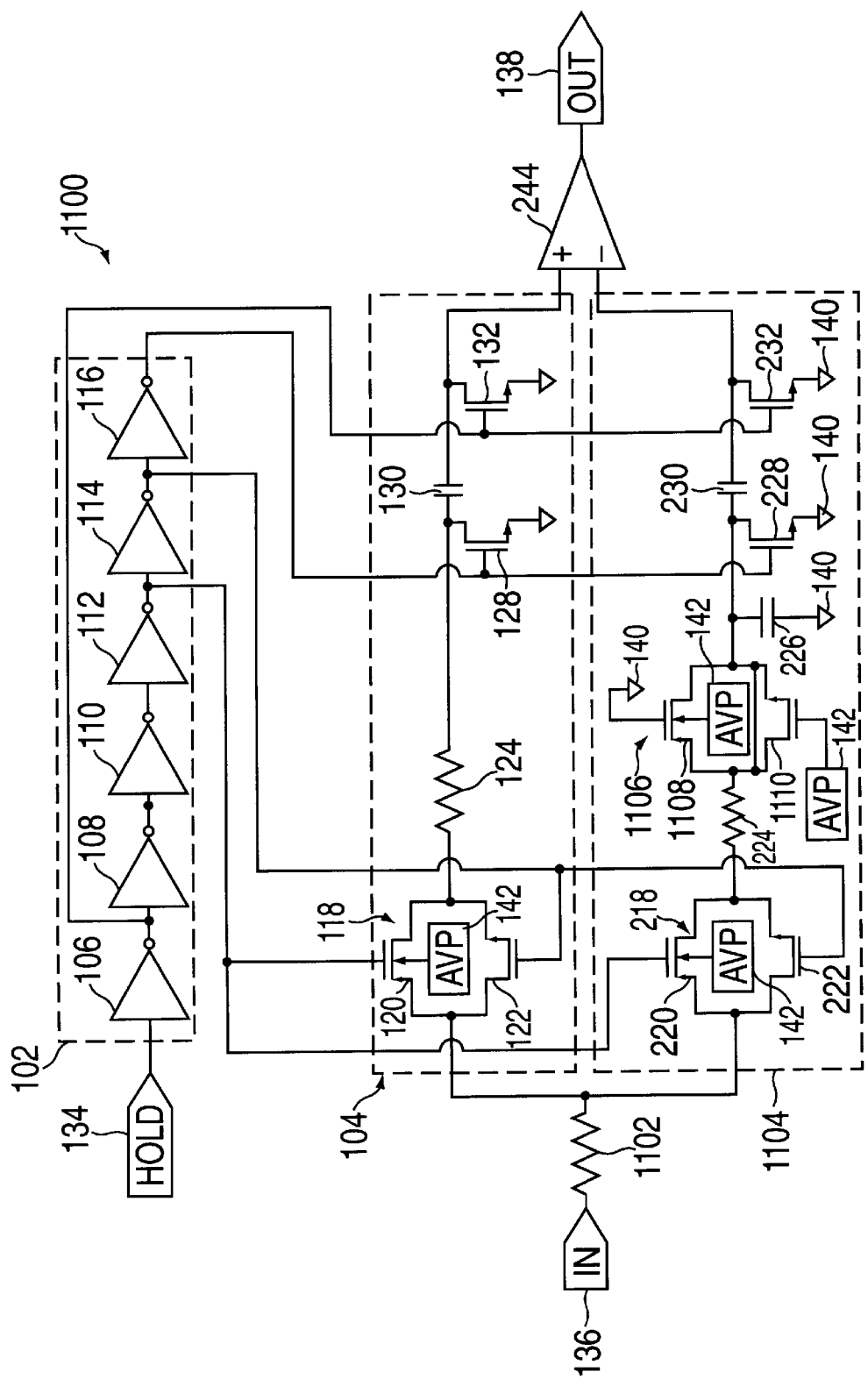
FIG. 11 is a schematic diagram of a sample and hold circuit in which an additional steering switch pair and an additional resistance are incorporated into an auxiliary sampling leg in order to produce canceling distortion that corresponds to distortion produced in an input source resistance in accordance with the present invention.

Still another variation of circuit 200 of FIG. 2 that cancels distortion produced by non-linear load currents in an input source resistance of a circuit being sampled is illustrated in FIG. 11. In a sample and hold circuit such as circuit 200 of FIG. 2, non-linear load currents may be produced by semiconductor junctions of input steering switches such as switches 120, 122, 220 and 222. These non-linear load currents may cause corresponding non-linear, voltage-drop distortions of a signal being sampled as the signal passes through the input source resistance of the circuit in which the signal originates. This distortion is present equally in both main sampling leg 104 and auxiliary sampling leg 204 of circuit 200 of FIG. 2. Accordingly, this distortion is not canceled by the use of auxiliary sampling leg 204 because the smaller size of sampling capacitor 230 with respect to the size of sampling capacitor 130 causes the relative size of the distortion at the negative input of differential amplifier 244 to be smaller than the corresponding distortion at the positive input of differential amplifier 244.

In order to cancel this input-source-resistance distortion, the size of the distortion must be increased in auxiliary sampling leg 204 prior to reaching sampling capacitor 230, where the size of the distortion is then decreased. As shown in circuit 1100 of FIG. 11, auxiliary sampling leg 1104 includes a steering switch pair 1106 to achieve this goal. Steering switch pair 1106 may be used to produce similar non-linear load currents in a pedestal resistor 224 and thereby create supplemental input-source-resistance distortion in auxiliary sampling leg 1104. Switch pair 1106 is formed from steering switches 1108 and 1110. The source and the drain of switch 1108 and the source and the drain of switch 1110 are all connected together, and connected to one side of pedestal resistor 224 and one side of capacitor 226. The gates of steering switches 1108 and 1110 are connected to ground 140 and positive voltage supply 142, respectively. The body terminal of switch 1108 is connected to positive voltage supply 142.

As shown, circuit 1100 also includes inverter bank 102, input source resistance 1102, main sampling leg 104, and differential amplifier 244. Input source resistance 1102 is usually caused by an external circuit that is being sampled. Beside the components and connections associated with steering switch pair 1106, the components of inverter bank 102, main sampling leg 104, auxiliary sampling leg 1104, and differential amplifier 244 are substantially the same as described above.

The sizes of pedestal resistor 224 and steering switch pair 1106 should be properly selected to produce the appropriate amount of supplemental distortion in auxiliary sampling leg 1104. In circuit 1100, pedestal resistor 224 is used to create distortion as well as being used to decouple sampling capacitor 230 from input steering switch pair 218. The sizes of pedestal resistor 224 and steering switch pair 1106 for illustrative circuit 1100 can be determined by maintaining the following relationship:

Auxiliary Parasitic Factors=
($C_{130}/C_{230}$)* Main Parasitic Factors,
wherein $C_{130}$ and $C_{230}$ are the capacitances of sampling capacitors 130 and 230, respectively, and the Main Parasitic Factors and the Auxiliary Parasitic Factors are defined as:

Main Parasitic Factors=
$R_{1102}*(C_{S120}+C_{D122}+C_{D120}+C_{S122}+C_{D128})+$
$R_{ON118}*(C_{D120}+C_{S122}+C_{D128})+R_{124}*C_{D128}+$
$R_{1102}*(C_{S220}+C_{D222}+C_{D220}+C_{S222}+C_{S1108}+C_{D1110}+C_{D1108}+C_{S1110}+C_{D228})$ and Auxiliary Parasitic Factors=
$R_{1102}*(C_{S220}+C_{D222}+C_{D220}+C_{S222}+C_{S1108}+C_{D1110}+C_{D1108}+C_{S1110}+C_{D228})+$
$R_{1102}*(C_{S120}+C_{D122}+C_{D120}+C_{S122}+C_{D128})+$
$R_{ON218}*(C_{D220}+C_{S222}+C_{S1108}+C_{D1110}+C_{D1108}+C_{S1110}+C_{D228})+$
$R_{224}*(C_{S1108}+C_{D1110}+C_{D1108}+C_{S1110}+C_{D228})$ wherein $R_{1102}$, $R_{ON118}$, $R_{ON218}$, and $R_{224}$ are respectively the resistance of input source resistance 1102, the ON-resistances of switches 118 and 218, and the resistance of pedestal resistor 224, and $C_{D120}$, $C_{S120}$, $C_{D122}$, $C_{S122}$, $C_{D128}$, $C_{D220}$, $C_{S220}$, $C_{D222}$, $C_{S222}$, $C_{D228}$, $C_{D1108}$, $C_{S1108}$, $C_{D1110}$, $C_{S1110}$ are respectively the capacitances of the drain and source of switch 120, the drain and source of switch 122, the drain of switch 128, the drain and source of switch 220, the drain and source of switch 222, the drain of switch 228, the drain and source of switch 1108, and the drain and source of switch 1110.

Figure 12:
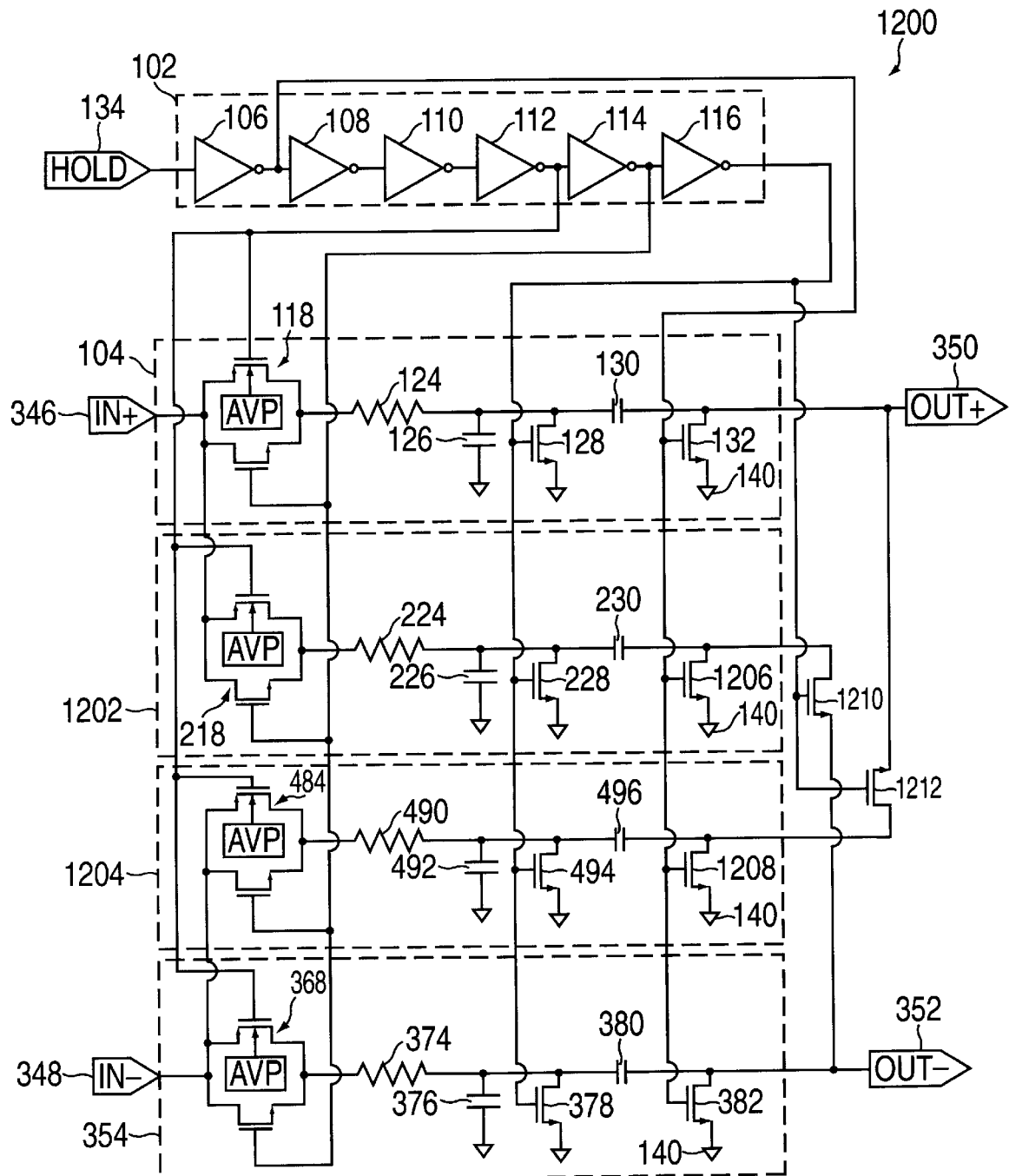
FIG. 12 is a schematic diagram of a differential sample and hold circuit in which switch charge injection distortion caused by modulation of sampling switches in main sampling legs is canceled by using sampling switches in the corresponding auxiliary sampling legs in accordance with the present invention.

A variation of circuit 400 of FIG. 4 that cancels switch charge injection distortion created in sampling capacitors 130 and 380 (FIG. 4) by modulation of sampling switches 132 and 382 (FIG. 4) from the impedance variations of input steering switches 118 and 368 (FIG. 4), respectively, is illustrated in FIG. 12. As shown, rather than only using a single sampling switch 132, 382 for each pair of main sampling leg 104, 354 and auxiliary sampling leg 483, 481, respectively, each sampling leg 104, 1202, 1204, and 354 in FIG. 12 comprises its own respective sampling switch 132, 1206, 1208, and 382. In this way the charge injection distortions created in sampling capacitors 130 and 380 by sampling switches 132 and 382 are canceled by corresponding charge injection distortions that are created in sampling capacitors 230 and 496 by sampling switches 1206 and 1208. Like sampling switches 132 and 382, the gates of sampling switches 1206 and 1208 are connected to the output of inverter 106, the drains of switches 1206 and 1208 are connected to one side of sampling capacitors 230 and 496, and the sources of switches 1206 and 1208 are connected to ground 140.

To combine the output signals and distortion in sampling capacitors 130 and 380 with the output signals and distortion in sampling capacitors 496 and 230, respectively, combining switches 1212 and 1210 are also provided in circuit 1200. The drain of switch 1212 is connected to the drain of sampling switch 1208 and one side of sampling capacitor 496, the source of sampling switch 1212 is connected to the drain of sampling switch 132, one side of sampling capacitor 130 and signal output 350, and the gate of switch 1212 is connected to the output of inverter 116. The drain of switch 1210 is connected to the drain of sampling switch 1206 and one side of sampling capacitor 230, the source of sampling switch 1210 is connected to the drain of sampling switch 382, one side of sampling capacitor 380 and signal output 352, and the gate of switch 1210 is connected to the output of inverter 116. In this way, at the same time that ground steering switches 128, 228, 494 and 378 close to provide a reference for sampling capacitors 130, 230, 496 and 380, respectively, combining switches 1212 and 1210 close to combine the signals and distortion on sampling capacitor 130 with that on sampling capacitor 496, and also to combine the signals and distortion on sampling capacitor 380 with that on sampling capacitor 230.

Figure 13:
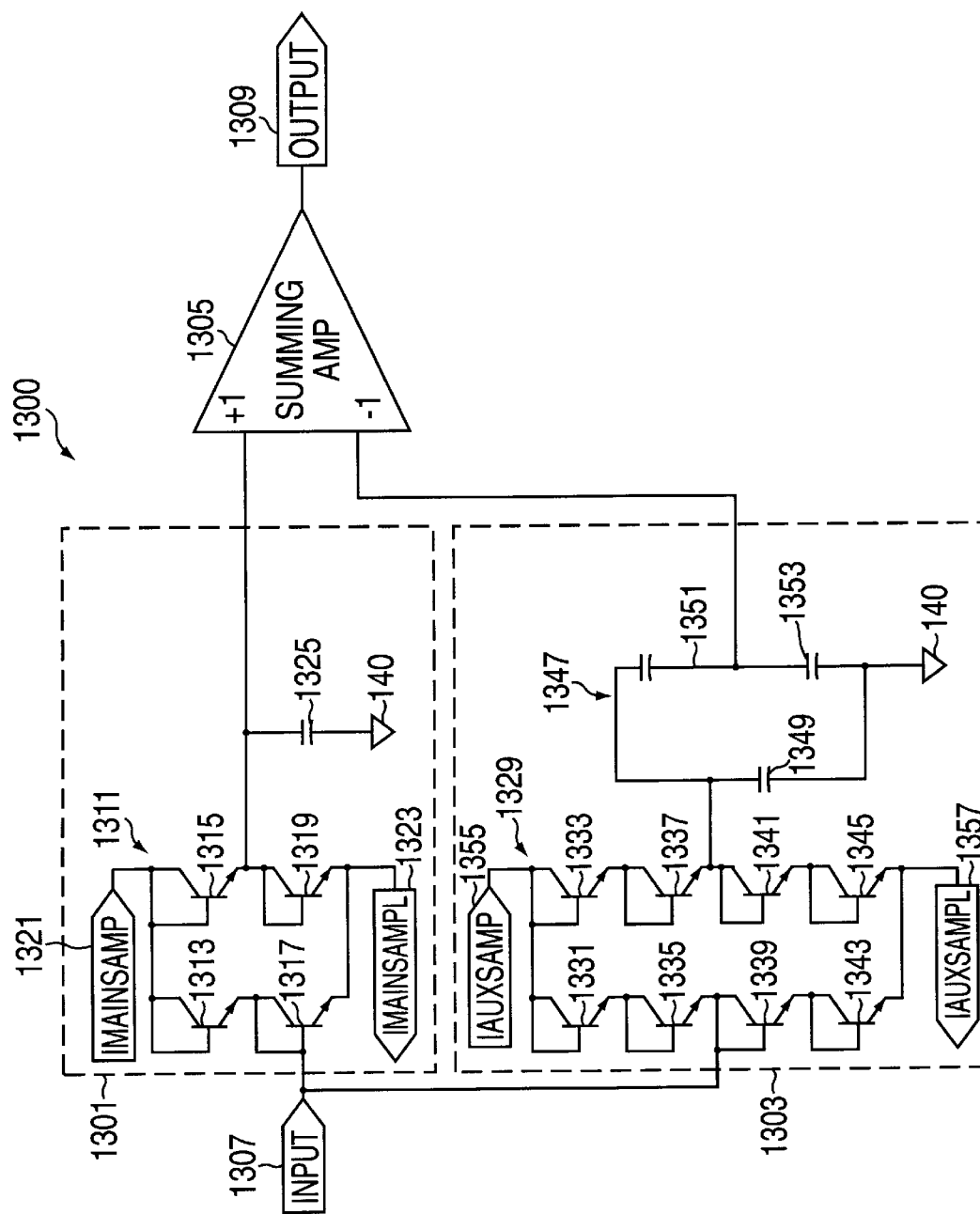
FIG. 13 is a schematic diagram of a sample and hold circuit with distortion cancellation that uses bipolar junction transistors (BJTs) in accordance with the present invention.

FIG. 13 illustrates a BJT variation of a sample and hold circuit 1300 incorporating the distortion canceling features of the present invention. As shown, circuit 1300 comprises main sampling leg 1301, auxiliary sampling leg 1303 and summing amplifier 1305. Main sampling leg 1301 and auxiliary sampling leg 1303 receive an input signal from signal input 1307, sample and hold that signal in response to current sources 1321, 1323, 1355 and 1357, and output the sampled signals to summing amp 1305. After summing the sampled signals from legs 1301 and 1303, summing amp 1305 drives signal output 1309.

Main sampling leg 1301 comprises bridge 1311, current sources 1321 and 1323, and sampling capacitor 1325. Bridge 1311 is formed from four diode-connected BJTs 1313, 1315, 1317 and 1319. Accordingly, leg 1301 could alternatively be implemented with diodes and/or any other devices configured as diodes. The collectors of BJTs 1313 and 1315 are connected to current source 1321. The emitter of BJT 1313 is connected to signal input 1307 and the collector of BJT 1317. The emitter of BJT 1315 is connected to the collector of BJT 1319, one side of sampling capacitor 1325 and the positive input of summing amp 1305. The emitters of BJTs 1317 and 1319 are connected to the input of current source 1323. The other side of sampling capacitor 1325 is connected to ground 140.

Auxiliary sampling leg 1303 comprises bridge 1329, current sources 1355 and 1357, and sampling capacitor network 1347. Bridge 1329 is formed from eight diode-connected BJTs 1331, 1333, 1335, 1337, 1339, 1341, 1343 and 1345. The collector of BJTs 1331 and 1333 are connected to the output of current source 1355, and the collectors of BJTs 1335 and 1337 are connected to the emitters of BJTs 1331 and 1333. The emitter of BJT 1335 is connected to signal input 1307 and to the collector of BJT 1339, and the emitter of BJT 1337 is connected to the collector of BJT 1341 and to the input of sampling capacitor network 1347. The emitters of BJTs 1339 and 1341 are connected to the collectors of BJTs 1343 and 1345, and the emitters of BJTs 1343 and 1345 are connected to the input of current source 1357.

Sampling capacitor network 1347 comprises three capacitors 1349, 1351 and 1353. One side of capacitor 1349 is connected to the emitter of BJT 1337, the collector of BJT 1341 and one side of capacitor 1351. The other side of capacitor 1349 is connected to one side of capacitor 1353 and ground 140. The other sides of capacitors 1351 and 1353 are connected to the negative input of summing amp 1305.

Each of BJTs 1313, 1315, 1317, 1319, 1331, 1333, 1335, 1337, 1339, 1341, 1343 and 1345 are preferably the same type and size to assure the same ON-resistance and capacitive parasitics. Although bridges 1311 and 1329 contain four and eight BJTs, respectively, other numbers of BJTs could be implemented in accordance with the principles of the present invention. The currents provided by current sources 1321, 1323, 1355 and 1357 are preferably identical, although current sources 1321 and 1323 could also differ from current sources 1355 and 1357.

In operation, circuit 1300 behaves as follows. An input signal is provided at signal input 1307. Current sources 1321, 1323, 1355 and 1357 are turned ON simultaneously to cause capacitor 1325 and capacitor network 1347 to track the voltages at signal input 1307. When current sources 1321, 1323, 1355 and 1357 are turned and held OFF, and reverse bias voltages are applied to current sources 1321, 1323, 1355, and 1357 instead, the voltages at capacitor 1325 and capacitor network 1347 become fixed. Because bridge 1329 has twice as many BJTs as bridge 1311, twice the distortion is produced by bridge 1329 while the size of the signal passed through from signal input 1307 is unchanged. Although twice the distortion is created by bridge 1329 as is created by bridge 1311, only half of the created distortion and half of the sampled signal are output by sampling capacitor network 1347. These voltages are then combined and output through signal output 1309 by summing amp 1305 to produce an output signal that is substantially free of distortion from bridges 1311 and 1329.

Figure 14:
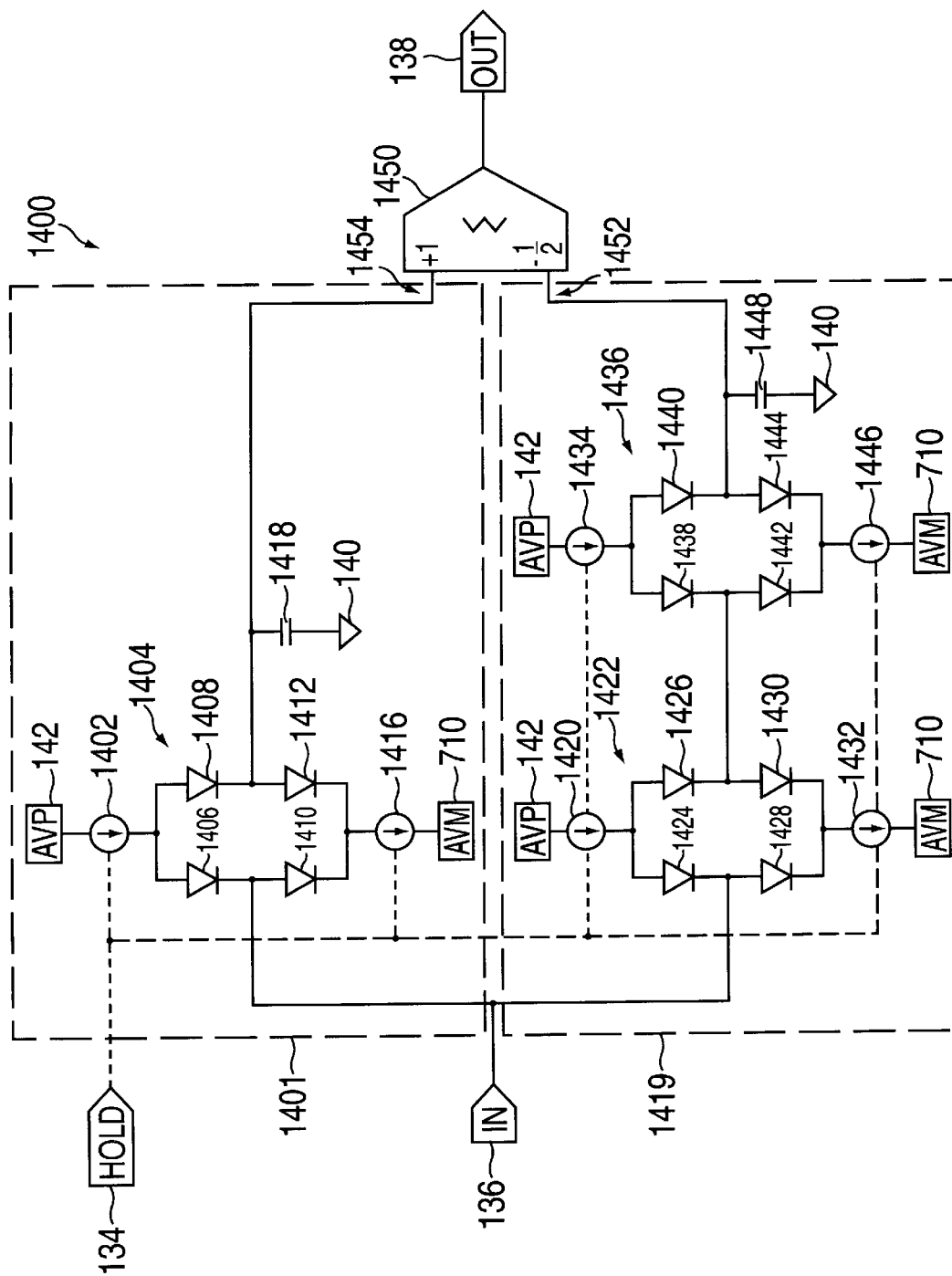
FIG. 14 is a schematic diagram of a sample and hold circuit with distortion cancellation that uses diode bridges in accordance with the present invention.

FIG. 14 illustrates a diode bridge variation of a sample and hold circuit 1400 incorporating the distortion canceling features of the present invention. As shown, circuit 1400 comprises main sampling leg 1401 and auxiliary sampling leg 1419 that are both driven by signal input 136 and controlled by hold input 134. Circuit 1400 also comprises summing amplifier 1450 that drives signal output 138 and that is driven by main sampling leg 1401 and auxiliary sampling leg 1419.

Main sampling leg 1401 comprises diode bridge 1404, identical current sources 1402 and 1416 and sampling capacitor 1418. Diode bridge 1404 is formed from four diodes 1406, 1408, 1410 and 1412. The input to current source 1402 is connected to positive voltage supply 142 and the output of current source 1402 is connected to the anodes of diodes 1406 and 1408. The cathode of diode 1406 is connected to both signal input 136 and the anode of diode 1410. The cathode of diode 1408 is connected to the anode of diode 1412, one side of sampling capacitor 1418 and positive input 1454 of summing amplifier 1450. The cathodes of diodes 1410 and 1412 are connected to the input of current source 1416, whose output is connected to negative voltage supply 710. Finally, the other side of sampling capacitor 1418 is connected to a ground 140.

Auxiliary sampling leg 1419 comprises diode bridges 1422 and 1436, current sources 1420, 1432, 1434 and 1446 that are preferably identical to current sources 1402 and 1416, and sampling capacitor 1448 that is preferably identical to sampling capacitor 1418. Diode bridges 1422 and 1436 each comprise four diodes 1424, 1426, 1428 and 1430, and 1438, 1440, 1442 and 1444, respectively. Each of bridges 1422 and 1436 are preferably identical to and arranged in substantially the same fashion as bridge 1404 with the exception that bridges 1422 and 1436 are respectively driven by current sources 1420 and 1434 instead of current source 1402, that bridges 1422 and 1436 are driven by current sources 1432 and 1446 instead of current source 1416, that the output of bridge 1420 drives the input to bridge 1436, and that the output of bridge 1436 is connected to grounded sampling capacitor 1448 and negative input 1452 of summing amplifier 1450.

In operation, sampling capacitor 1418 of main sampling leg 1401 tracks the voltage at signal input 136 when current sources 1402 and 1416 are turned ON under the control of hold input 134. When current sources 1402 and 1416 are subsequently turned OFF, the voltage on sampling capacitor 1418 is held at the voltage at signal input 136 at that time. Likewise, in auxiliary sampling leg 1419, the voltage on sampling capacitor 1448 tracks that at signal input 136 when current sources 1420, 1432, 1434 and 1446 are turned ON, and the voltage on sampling capacitor 1448 is held when current sources 1420, 1432, 1434 and 1436 are turned OFF. Because identical sampling capacitors 1418 and 1448 and twice the number of identical diode bridges 1422 and 1436 are used in auxiliary sampling leg 1419, auxiliary sampling leg 1419 produces twice the distortion that is produced in main sampling leg 1401. This canceling distortion is then reduced to being of the same size as that received from main sampling leg 1401 by negative input 1452 of summing amplifier 1450. As shown, negative input 1452 of summing amplifier 1450 divides the distortion and signal in half prior to adding it to the distortion and signal of main sampling leg 1401. In this way, the distortion created by diode bridges is canceled out in summing amplifier 1450 while only half of the output signal is lost.

Although two diode bridges 1422 and 1436 that are identical to diode bridge 1404 and that each have four diodes are illustrated in FIG. 14, any number of diode bridges, each having any number, type, or size of diodes, could also be used in accordance with the present invention. For example, if three diode bridges that are identical to the diode bridge in main sampling leg 1401 were used in auxiliary sampling leg 1419 instead of the two shown, a summing amplifier 1450 would be chosen with a negative input 1452 that divides the signal that is input to amplifier 1450 by three instead of two. Likewise, although circuit 1400 is illustrated with two identical capacitors 1418 and 1448, other numbers, types, and sizes of diodes could also be used in accordance with the present invention. Similarly, although current sources 1402, 1416, 1420, 1432, 1434 and 1446 are all preferably identical, different types of current sources could be used for each pair of current sources 1402 and 1416, 1420 and 1432, and 1434 and 1446.

Figure 15:
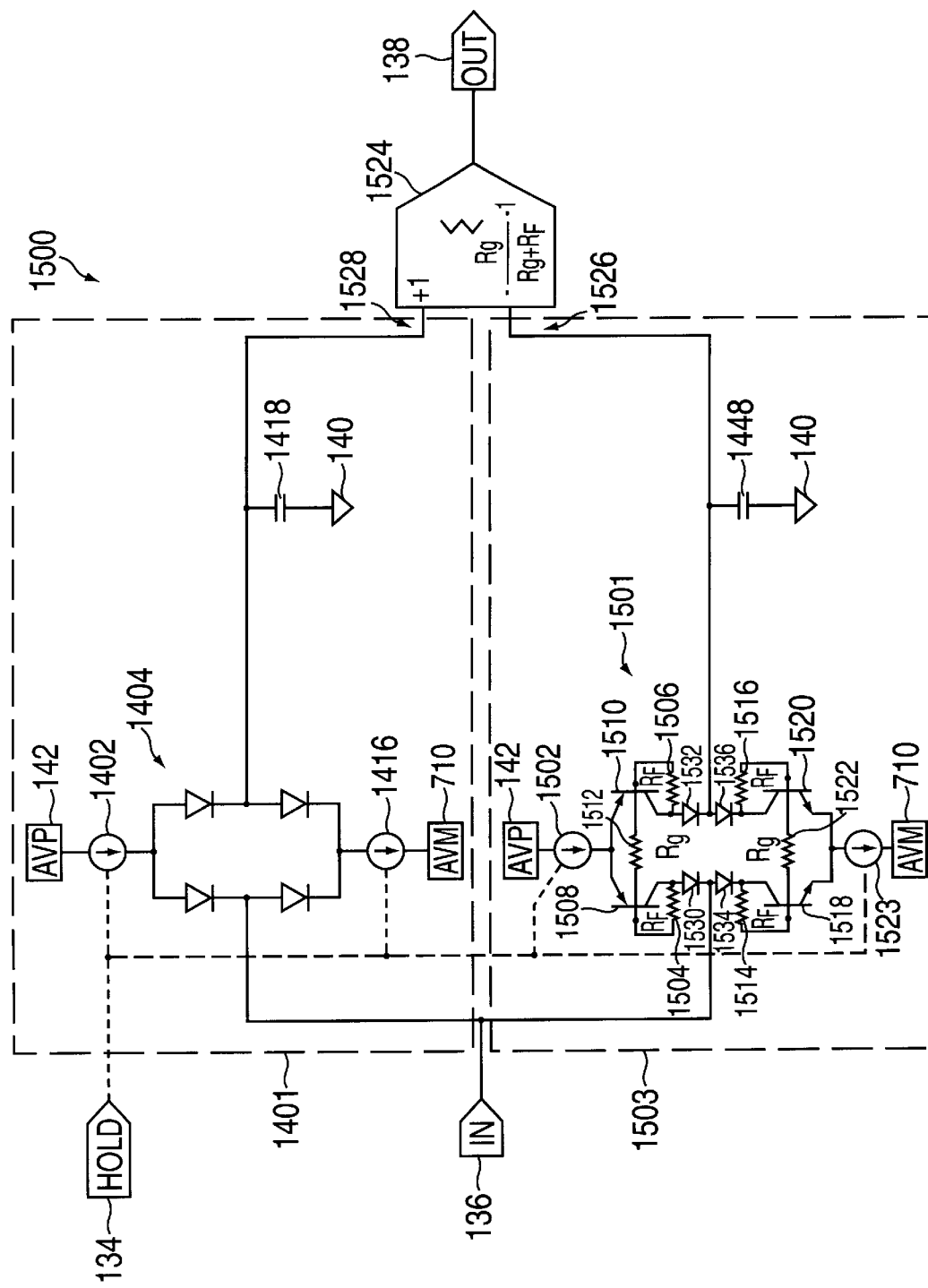
FIG. 15 is a schematic diagram of a sample and hold circuit with distortion cancellation that uses a combination of a diode bridge and BJTs in accordance with the present invention.

FIG. 15 illustrates a combined BJT and diode bridge variation of a sample and hold circuit 1500 incorporating the distortion canceling features of the present invention. As shown, circuit 1500 comprises main sampling leg 1401, auxiliary sampling leg 1503 and summing amplifier 1524. Main sampling leg 1401 is substantially the same as main sampling leg 1401 described above in connection with circuit 1400 of FIG. 14. Auxiliary sampling leg 1503, however, uses BJTs, diodes, and resistors to control the distortion created in auxiliary sampling leg 1503.

Auxiliary sampling leg 1503 comprises identical current sources 1502 and 1523, bridge 1501, and sampling capacitor 1448 that is preferably identical to sampling capacitor 1418. Bridge 1501 includes resistors 1504, 1506, 1512, 1514, 1516 and 1522, diodes 1530, 1532, 1534, and 1536, and BJTs 1508, 1510, 1518 and 1520. The input of current source 1502 is connected to positive voltage supply 142 and the output of current source 1502 is connected to the emitters of BJTs 1508 and 1510. The base of BJT 1508 is connected to one side of resistor 1504 and one side of resistor 1512. The base of BJT 1510 is connected to one side of resistor 1506 and the other side of resistor 1512. The other side of resistor 1504 is connected to the collector of BJT 1508 and the anode of diode 1530. The other side of resistor 1506 is connected to the collector of BJT 1510 and the anode of diode 1532. The cathode of diode 1530 is connected to signal input 136 and the anode of diode 1534. The cathode of diode 1534 is connected to one side of resistor 1514 and the collector of BJT 1518. The cathode of diode 1532 is connected to grounded sampling capacitor 1448, negative input 1526 of summing amplifier 1524, and the anode of diode 1536. The cathode of diode 1536 is connected to one side of resistor 1516 and the collector of BJT 1520. The other side of resistor 1514 and one side of resistor 1522 are connected to the base of BJT 1518. The other side of resistor 1516 and the other side of resistor 1522 are connected to the base of BJT 1520. The emitters of BJTs 1518 and 1520 are connected to the input of current source 1523, whose output is connected to negative voltage supply 710.

During operation, bridge 1501 produces a distortion that is determined by the values of resistors 1504, 1506, 1512, 1514, 1516 and 1522. As indicated by the labels "$R_F$" and "$R_G$" in FIG. 15, resistors 1504, 1506, 1514 and 1516 preferably have identical values, and resistors 1512 and 1522 preferably have identical values. As also indicated by the label on negative input 1526 of summing amplifier 1524, the distortion created by bridge 1501 is proportional to that created by bridge 1401 by the term $R_G/(R_G+R_F)+1$. Thus, the level of distortion produced in auxiliary sampling leg 1503 and the amount of sampled signal that is canceled in summing amplifier 1524 can be controlled by properly selecting the values of $R_F$ and $R_G$.

Figure 16:
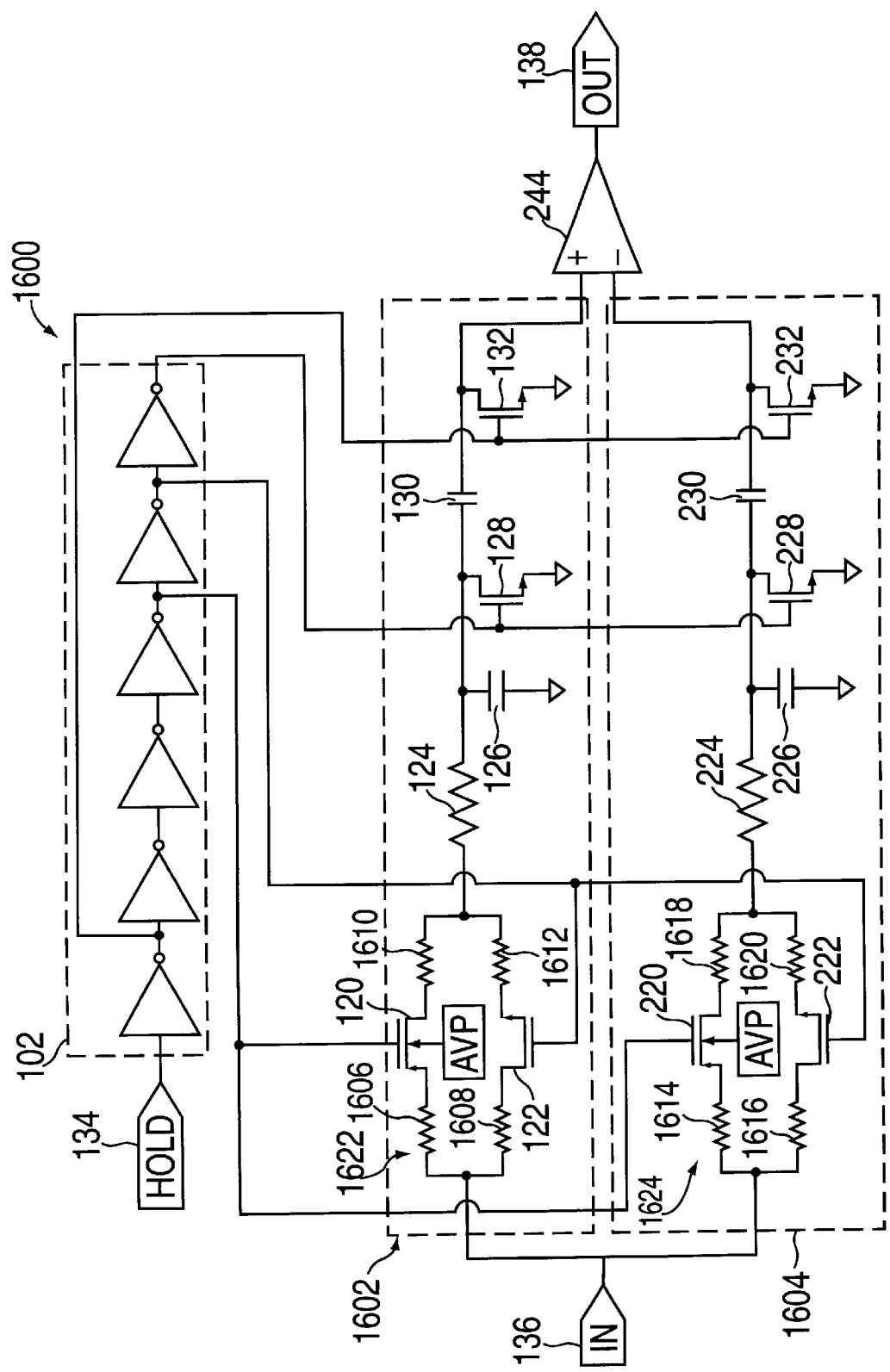
FIG. 16 is a schematic diagram of a sample and hold circuit that additionally cancels distortion due to the linear drain and source terminal resistances of each switch in the input steering switch pair of the main sampling leg in accordance with the present invention.

FIG. 16 illustrates a circuit 1600 that is a variation of circuit 200 illustrated in FIG. 2 and which cancels distortion due to the linear terminal resistances of the switches of the input steering switch pair in the main sampling leg in addition to canceling the distortion due to the non-linear resistances of these switches. As shown, circuit 1600 incorporates input steering switch pairs 1622 and 1624 in main and auxiliary sampling legs 1602 and 1604 instead of input steering switch pairs 118 and 218, respectively, of circuit 200. Switch 120 of input steering switch pair 1622 has source terminal resistance 1606 and drain terminal resistance 1610. Switch 122 of input steering switch pair 1622 has drain terminal resistance 1608 and source terminal resistance 1612. Switch 220 of input steering switch pair 1624 has source terminal resistance 1614 and drain terminal resistance 1618. Switch 222 of input steering switch pair 1624 has drain terminal resistance 1616 and source terminal resistance 1620. Beside the replacement of switch pairs 118 and 218 of circuit 200 with switch pairs 1622 and 1624, the components and connections of circuit 1600 are substantially the same as those described above for circuit 200 of FIG. 2.

In order to cancel the linear terminal resistances of switches 120 and 122, the transistor layout of circuit 1600 is preferably shaped so that resistances 1614, 1616, 1618, and 1620 are proportional to resistances 1606, 1608, 1610, and 1612 by the same ratio as the conductances or sizes of switches 220 and 222 are to switches 120 and 122, respectively. This relationship can be illustrated by the following equation:

$$(W_{120}/L_{120})/(W_{220}/L_{220}) = (W_{122}/L_{122})/(W_{222}/L_{222}) = R_{1614}/R_{1606} = R_{1618}/R_{1610} = R_{1616}/R_{1608} = R_{1620}/R_{1612} = G_{120}/G_{220} = G_{122}/G_{222}$$

where $W_{120}$, $W_{122}$, $W_{220}$, and $W_{222}$ are the widths of the channels of switches 120, 122, 220, and 222, respectively, $L_{120}$, $L_{122}$, $L_{220}$, and $L_{222}$ are the lengths of the channels of switches 120, 122, 220, and 222, respectively, $R_{1606}$, $R_{1610}$, $R_{1608}$, $R_{1612}$, $R_{1614}$, $R_{1618}$, $R_{1616}$, and $R_{1620}$ are the linear terminal resistances of the source and the drain of switch 120, the drain and the source of switch 122, the source and the drain of switch 220, and the drain and the source of switch 222, respectively, and $G_{120}$, $G_{122}$, $G_{220}$, ard $G_{222}$ are the conductances of switches 120, 122, 220, and 222, respectively. If the parasitic gate, source, and drain capacitances of switches 120, 122, 220, and 222 are ignored, this relationship can be illustrated by the following simpler equation:

$$(W_{120}/L_{120})/(W_{220}/L_{220}) = (_{122}/L_{122})/(W_{222}/L_{222}) = (R_{1614}+R_{1618})/(R_{1606}+R_{1610}) = (R_{1616}+R_{1620})/(R_{1608}+R_{1612}) = G_{120}/G_{220} = G_{122}/G_{222}.$$

By providing linear terminal resistances in switches 220 and 222 that are proportional to the linear terminal resistances in switches 120 and 122 by the same ratio as the conductances and sizes of the switches, corresponding distortion will be produced in the linear terminal resistances of switches 220 and 222 that will cancel out the distortion produced in the linear terminal resistances of switches 120 and 122 when the distortions are combined together.

Persons skilled in the art will thus appreciate that the present invention can be practiced by other than the described embodiments, which are presented for purposes of illustration and not of limitation, and the present invention is limited only by the claims which follow.

What is claimed is:

1. A distortion canceling circuit for canceling sampling harmonic distortion that is produced in addition to an output signal while sampling an input signal in a main sampling leg of a sample and hold circuit, said distortion canceling circuit comprising:

an auxiliary sampling leg that produces canceling harmonic distortion that corresponds to at least a portion of said sampling harmonic distortion produced in said main sampling leg, wherein said auxiliary sampling leg comprises at least one input switching mechanism that generates at least a portion of said canceling harmonic distortion that receives said input signal at an input to said at least one input switching mechanism and that controls when said input signal is available at an output of said at least one input switching mechanism; and a combining circuit that combines said sampling distortion and said canceling harmonic distortion so that said canceling harmonic distortion cancels said at least a portion of said sampling harmonic distortion while only canceling a portion of said output signal.

2. The distortion canceling circuit of claim 1 wherein said auxiliary sampling leg, in producing said canceling harmonic distortion, first generates said canceling harmonic distortion so that said canceling harmonic distortion is greater than said at least a portion of said sampling harmonic distortion, and then reduces said canceling harmonic distortion generated so that said canceling harmonic distortion is substantially equal to said at least a portion of said sampling harmonic distortion.

3. The distortion canceling circuit of claim 1 wherein said auxiliary sampling leg further comprises:

a sampling capacitor circuit that samples said input signal provided at said output of said at least one input switching mechanism.

4. The distortion canceling circuit of claim 3 wherein said at least one input switching mechanism comprises an input steering switch.

5. The distortion canceling circuit of claim 3 wherein said at least one input switching mechanism comprises a bridge of diode-connected transistors.

6. The distortion canceling circuit of claim 3 wherein said at least one input switching mechanism comprises a bridge of diodes.

7. The distortion canceling circuit of claim 3 wherein said at least one input switching mechanism comprises a bridge including a transistor and a resistor.

8. The distortion canceling circuit of claim 3 wherein said sampling capacitor circuit comprises a single capacitor.

9. The distortion canceling circuit of claim 3 wherein said sampling capacitor circuit comprises a network of capacitors.

10. The distortion canceling circuit of claim 3 wherein said at least one input switching mechanism generates said canceling harmonic distortion so that said canceling harmonic distortion is greater than said at least a portion of said sampling harmonic distortion by having a smaller size than a corresponding at least one input switching mechanism in said main sampling leg.

11. The distortion canceling circuit of claim 10 wherein said sampling capacitor circuit reduces said canceling harmonic distortion generated by said at canceling harmonic distortion is substantially equal to said at least a portion of said sampling harmonic distortion by having a smaller capacitance than a corresponding sampling capacitor circuit in said main sampling leg.

12. The distortion canceling circuit of claim 3 wherein said auxiliary sampling leg generates said canceling harmonic distortion by having a larger total capacitance than said main sampling leg.

13. The distortion canceling circuit of claim 12 wherein said sampling capacitor circuit reduces said canceling harmonic distortion generated so that said harmonic distortion is substantially equal to said at least a portion of said sampling harmonic distortion by having a smaller capacitance than a corresponding sampling capacitory circuit in said main sampling leg.

14. The distortion canceling circuit of claim 3 wherein said auxiliary sampling leg further comprises a pedestal resistor connecting said output of said at least one input switching mechanism to said sampling capacitor circuit, and wherein said pedestal resistor is sized to have a substantially-same-size ratio with respect to a corresponding pedestal resistor in said main sampling leg as a sampling capacitor circuit in said main sampling leg has with respect to said sampling capacitor circuit in said auxiliary sampling leg.

15. The distortion canceling circuit of claim 3 wherein said auxiliary sampling leg further comprises a capacitive load connected to said output of said at least one input switching mechanism, and wherein said capacitive load creates distortion due to parasitic capacitance in said auxiliary sampling leg that substantially cancels at least a portion of distortion due to parasitic capacitance created in said main sampling leg.

16. The distortion canceling circuit of claim 3 wherein said auxiliary sampling leg further comprises a plurality of cascaded sampling poles.

17. The distortion canceling circuit of claim 3 wherein said auxiliary sampling leg further comprises an additional switching mechanism connected to said output of said at least one input switching mechanism that creates distortion that substantially cancels at least a portion of distortion due to input source resistance.

18. The distortion canceling circuit of claim 3 wherein a terminal resistance of said at least one input switching mechanism creates distortion that substantially cancels at least a portion of distortion due to a terminal resistance of an input switching mechanism in said main sampling leg.

19. A method for canceling harmonic sampling distortion that is produced in addition to an output signal while sampling an input signal in a main sampling leg of a sample and hold circuit, said method comprising:

receiving said input signal at an input to at least one input switching mechanism;

producing canceling distortion in at least one switching mechanism of an auxiliary sampling leg that corresponds to at least a portion of said sampling distortion produced in said main sampling leg;

controlling when said input signal is available at an output of said at least one input switching mechanism; and combining said sampling distortion and said canceling distortion so that said canceling distortion cancels said at least a portion of said sampling distortion while only canceling a portion of said output signal.

20. The method of claim 19 wherein said producing comprises:

generating said canceling harmonic distortion so that said canceling harmonic distortion is greater than said at least a portion of said sampling harmonic distortion; and reducing said canceling harmonic distortion generated so that said canceling harmonic distortion is substantially equal to said at least a portion of said sampling harmonic distortion.

21. The method of claim 19 wherein said producing comprises:

sampling, using a sampling capacitor circuit, said input signal provided at said output of said at least one input switching mechanism.

22. The method of claim 21 wherein said at least one input switching mechanism comprises an input steering switch.

23. The method of claim 21 wherein said at least one input switching mechanism comprises a bridge of diode-connected transistors.

24. The method of claim 21 wherein said at least one input switching mechanism comprises a bridge of diodes.

25. The method of claim 21 wherein said at least one input switching mechanism comprises a bridge including a transistor and a resistor.

26. The method of claim 21 wherein said sampling capacitor circuit comprises a single capacitor.

27. The method of claim 21 wherein said sampling capacitor circuit comprises a network of capacitors.

28. The method of claim 21 wherein said producing further comprises generating said canceling harmonic distortion so that said canceling harmonic distortion is greater than said at least a portion of said sampling harmonic distortion by said at least one input switching mechanism having a smaller size than a corresponding at least one input switching mechanism in said main sampling leg.

29. The method of claim 28 wherein said producing further comprises reducing said canceling harmonic distortion generated by said at least one input switching mechanism so that said canceling harmonic distortion is substantially equal to said at least a portion of said sampling harmonic distortion by said sampling capacitor circuit having a smaller capacitance than a corresponding sampling capacitor circuit in said main sampling leg.

30. The method of claim 21 wherein said producing further comprises generating said canceling harmonic distortion is that said canceling harmonic distortion is greater than said at least a portion of said sampling harmonic distortion by said auxiliary sampling leg having a larger total capacitance than said main sampling leg.

31. The method of claim 30 wherein said producing further comprises reducing said canceling harmonic distortion generated so that said canceling harmonic distortion is substantially equal to said at least a portion of said sampling harmonic distortion by said sampling capacitor circuit having a smaller capacitance than a corresponding sampling capacitor circuit in said main sampling leg.

32. The method of claim 21 further comprising connecting a pedestal resistor between said output of said at least one input switching mechanism and said sampling capacitor circuit, wherein said pedestal resistor is sized to have a substantially-same-size ratio with respect to a corresponding pedestal resistor in said main sampling leg as a sampling capacitor circuit in said main sampling leg has with respect to said sampling capacitor circuit in said auxiliary sampling leg.

33. The method of claim 21 further comprising connecting a capacitive load to said output of said at least one input switching mechanism, wherein said capacitive load creates distortion due to parasitic capacitance in said auxiliary sampling leg that substantially cancels at least a portion of distortion due to parasitic capacitance created in said main sampling leg.

34. The method of claim 21 further comprising incorporating a plurality of cascaded sampling poles in said auxiliary sampling leg.

35. The method of claim 21 further comprising connecting an additional switching mechanism to said output of said at least one input switch mechanism that creates distortion that substantially cancels at least a portion of distortion due to input source resistance.

36. The method of claim 21 further comprising creating distortion using a terminal resistance of said at least one input switching mechanism to substantially cancel at least a portion of distortion due to a terminal resistance of an input switching mechanism in said main sampling leg.

* * * * *

UNITED STATES PATENT AND TRADEMARK OFFICE
CERTIFICATE OF CORRECTION

PATENT NO. : 6,084,440
DATED : July 4, 2000
INVENTOR(S) : Circuits and methods for canceling harmonic distortion in sample and hold circuits It is certified that error appears in the above-identified patent and that said Letters Patent is hereby corrected as shown below:

Column 7,
Line 25, change "(circuit" to --circuit--.

Column 9,
Line 19, change "80" to --803--.
Line 67, change "14C," to --140,--.

Column 10,
Line 18, change "he" to --be--.

Column 17,
Line 26, change "$(_{122}/L_{122})$" to -- $(W_{122}/L_{122})$ -- and change "$(R_{16}/4$" to -- $(R_{1614}$--.

Signed and Sealed this

Tenth Day of July, 2001

*Attest:*

*Attesting Officer*

NICHOLAS P. GODICI
*Acting Director of the United States Patent and Trademark Office*